(12) United States Patent
Futatsuyama

(10) Patent No.: US 7,916,548 B2
(45) Date of Patent: Mar. 29, 2011

(54) NON-VOLATILE SEMICONDUCTOR STORAGE DEVICE AND MEMORY SYSTEM

(75) Inventor: Takuya Futatsuyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 12/418,215

(22) Filed: Apr. 3, 2009

(65) Prior Publication Data

US 2009/0251971 A1 Oct. 8, 2009

(30) Foreign Application Priority Data

Apr. 4, 2008 (JP) ................................ P2008-097752

(51) Int. Cl.
*G11C 16/06* (2006.01)
(52) U.S. Cl. ............. 365/185.22; 365/185.18; 365/185.2
(58) Field of Classification Search ............. 365/185.22, 365/185.2, 185.18
See application file for complete search history.

(56) References Cited

U.S. PATENT DOCUMENTS

| 6,327,183 | B1 * | 12/2001 | Pawletko et al. | ........ 365/185.18 |
| 7,272,050 | B2 | 9/2007 | Han et al. | |
| 7,388,790 | B2 * | 6/2008 | Maejima et al. | ......... 365/185.25 |
| 2007/0279981 | A1 | 12/2007 | Abe et al. | |
| 2008/0089135 | A1 | 4/2008 | Ito | |
| 2009/0196083 | A1 * | 8/2009 | Norman | ........................... 365/51 |
| 2009/0196102 | A1 * | 8/2009 | Kim | ........................ 365/185.11 |

FOREIGN PATENT DOCUMENTS

JP 2005-235260 9/2005
JP 2006-54036 2/2006

OTHER PUBLICATIONS

U.S. Appl. No. 12/499,237, filed Jul. 8, 2009, Futatsuyama.

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A non-volatile semiconductor storage device includes: a memory cell array including memory strings, each of the memory strings having: a first end; a second end; and a plurality of memory cells connected in series between the first end and the second end, the memory cells being categorized into memory cell groups; a first end that is one end of the memory string; and a second end that is the other end of the memory string; first selection transistors connected to the respective first ends of the memory strings; a plurality of second selection transistors connected to the respective second ends of the memory strings; bit lines connected to the respective second selection transistors; word lines connected to the memory cells; and a control circuit configured to apply different control voltages to the respective word lines.

15 Claims, 34 Drawing Sheets

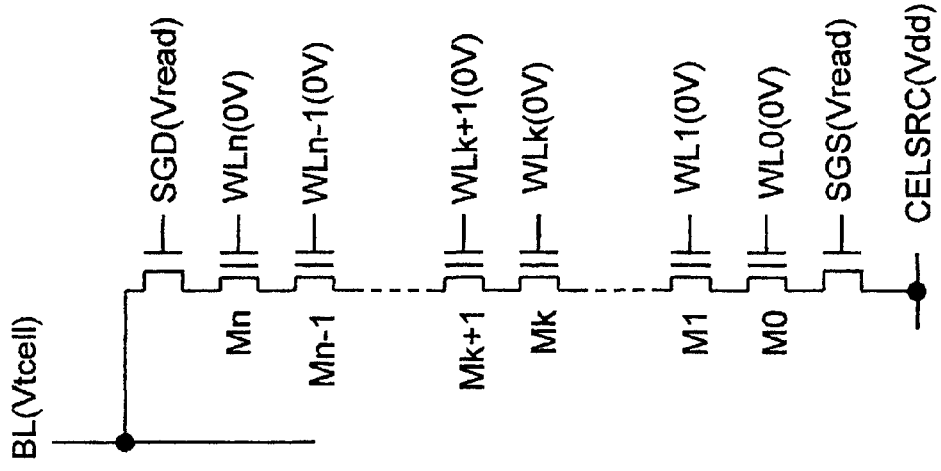
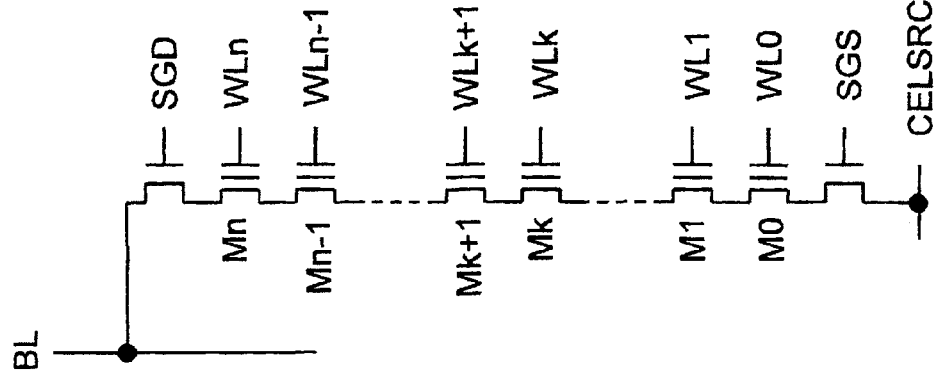

FIRST ERASE VERIFICATION OPERATION

SECOND ERASE VERIFICATION OPERATION

FIG. 7

| | 1st | 2nd | 1st | 2nd | REDUCTION IN INFLUENCE OF POTENTIAL DIFFERENCE ON ADJACENT WORD LINES |
|---|---|---|---|---|---|
| WL63 | Vread | 0V | | 0V | |
| WL62 | Vread | 0V | Vread | 0V | |
| .. | Vread | 0V | Vread | 0V | |
| WL33 | Vread | 0V | Vread | 0V | |
| WL32 | Vread | 0V | Vread | 0V | |
| WL31 | 0V | Vread | 0V | Vread | |
| WL30 | 0V | Vread | 0V | Vread | |
| .. | 0V | Vread | 0V | Vread | |
| WL1 | 0V | Vread | 0V | Vread | |
| WL0 | 0V | Vread | 0V | Vread | |

FIG. 8A
FIG. 8B
FIRST ERASE VERIFICATION OPERATION
SECOND ERASE VERIFICATION OPERATION
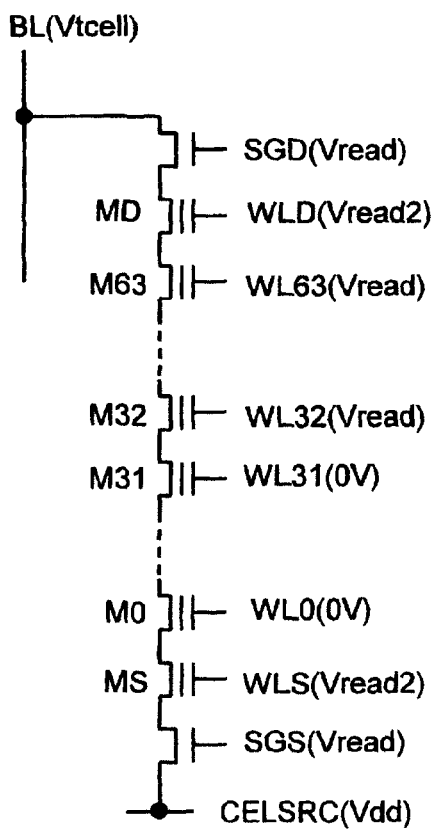
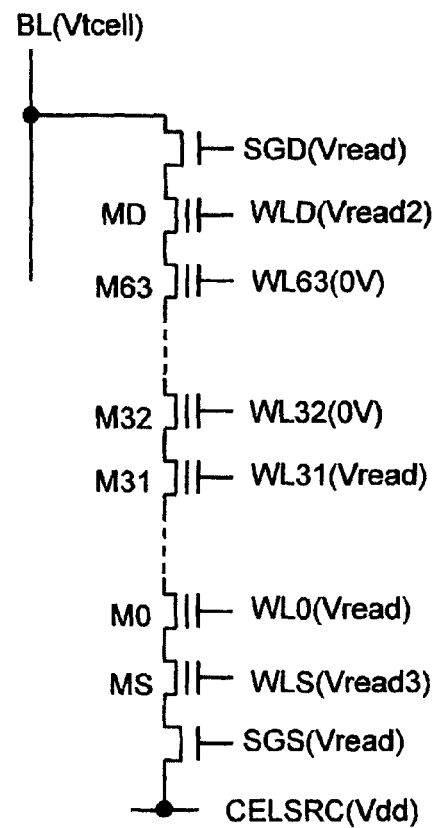

FIG. 11

| | 1st | 2nd | 3rd | REDUCTION IN INFLUENCE OF POTENTIAL DIFFERENCE ON ADJACENT WORD LINES | | |
|---|---|---|---|---|---|---|
| | | | | 1st | 2nd | 3rd |
| WL63 | Vread | Vread | 0V | | Vread | 0V |
| WL62 | | | | | | |
| ⋮ WL43 | | | | | | |
| WL42 | Vread | 0V | Vread | Vread | 0V | Vread |
| WL41 | | | | | | |
| WL40 | | | | | | |
| ⋮ WL22 | | | | | | |
| WL21 | 0V | Vread | Vread | 0V | Vread | Vread |
| WL20 | | | | | | |
| WL19 | | | | | | |
| ⋮ WL1 | | | | | | |
| WL0 | | | | | | |

FIRST ERASE VERIFICATION OPERATION

SECOND ERASE VERIFICATION OPERATION

FIG. 14

|      | 1st    | 2nd    |
|------|--------|--------|
| WL63 | 0V     | Vread4 |
| WL62 | Vread4 | 0V     |
| ⋮    | ⋮      | ⋮      |
| WL33 | Vread4 | 0V     |
| WL32 | 0V     | Vread4 |
| WL31 | Vread4 | 0V     |
| WL30 | 0V     | Vread4 |
| ⋮    | ⋮      | ⋮      |
| WL1  | 0V     | Vread4 |
| WL0  | Vread4 | 0V     |

FIRST ERASE VERIFICATION OPERATION

SECOND ERASE VERIFICATION OPERATION

FIG. 17

|  | 1st | 2nd |
|---|---|---|
| WLD | Vread2 | Vread2 |
| WL63 | 0V | Vread4 |
| WL62 | Vread4 | 0V |
| ⋮ | ⋮ | ⋮ |
| WL33 | Vread4 | 0V |
| WL32 | 0V | Vread4 |
| WL31 | Vread4 | 0V |
| WL30 | 0V | Vread4 |
| ⋮ | ⋮ | ⋮ |
| WL1 | 0V | Vread4 |
| WL0 | Vread4 | 0V |
| WLS | Vread3 | Vread3 |

FIG. 19A  FIRST ERASE VERIFICATION OPERATION

FIG. 19B  SECOND ERASE VERIFICATION OPERATION

FIG. 19C  THIRD ERASE VERIFICATION OPERATION

FIG. 20

|      | 1st    | 2nd    | 3rd    |
|------|--------|--------|--------|
| WL63 | 0V     | Vread5 | Vread5 |
| WL62 | Vread5 | Vread5 | 0V     |
| WL61 | Vread5 | 0V     | Vread5 |
| WL60 | 0V     | Vread5 | Vread5 |
| ⋮    | ⋮      | ⋮      | ⋮      |
| WL33 | 0V     | Vread5 | Vread5 |
| WL32 | Vread5 | Vread5 | 0V     |
| WL31 | Vread5 | 0V     | Vread5 |
| WL30 | 0V     | Vread5 | Vread5 |
| ⋮    | ⋮      | ⋮      | ⋮      |
| WL3  | 0V     | Vread5 | Vread5 |
| WL2  | Vread5 | Vread5 | 0V     |
| WL1  | Vread5 | 0V     | Vread5 |
| WL0  | 0V     | Vread5 | Vread5 |

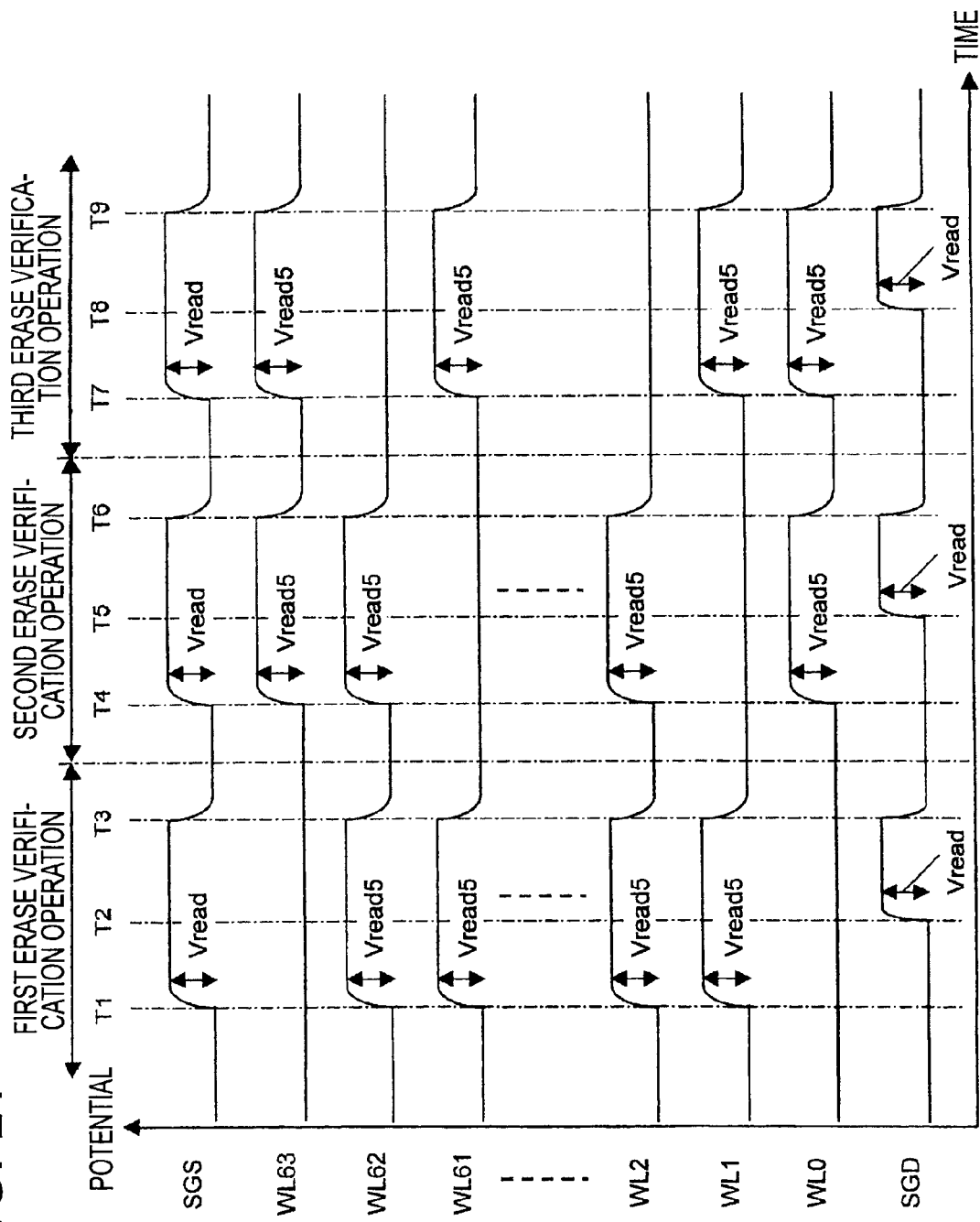

FIG. 23

|      | 1st    | 2nd    | 3rd    |
|------|--------|--------|--------|
| WLD  | Vread2 | Vread2 | Vread2 |
| WL63 | 0V     | Vread5 | Vread5 |
| WL62 | Vread5 | Vread5 | 0V     |
| WL61 | Vread5 | 0V     | Vread5 |
| WL60 | 0V     | Vread5 | Vread5 |
| ⋮    | ⋮      | ⋮      | ⋮      |
| WL33 | 0V     | Vread5 | Vread5 |
| WL32 | Vread5 | Vread5 | 0V     |
| WL31 | Vread5 | 0V     | Vread5 |
| WL30 | 0V     | Vread5 | Vread5 |
| ⋮    | ⋮      | ⋮      | ⋮      |
| WL3  | 0V     | Vread5 | Vread5 |
| WL2  | Vread5 | Vread5 | 0V     |
| WL1  | Vread5 | 0V     | Vread5 |
| WL0  | 0V     | Vread5 | Vread5 |
| WLS  | Vread3 | Vread3 | Vread3 |

FIRST ERASE VERIFICATION OPERATION

SECOND ERASE VERIFICATION OPERATION

THIRD ERASE VERIFICATION OPERATION

FOURTH ERASE VERIFICATION OPERATION

FIG. 27

|      | 1st    | 2nd    | 3rd    | 4th    |
|------|--------|--------|--------|--------|
| WL63 | 0V     | Vread6 | Vread  | Vread6 |
| WL62 | Vread6 | 0V     | Vread6 | Vread  |
| WL61 | Vread  | Vread6 | 0V     | Vread6 |
| WL60 | Vread6 | Vread  | Vread6 | 0V     |
| ⋮    | ⋮      | ⋮      | ⋮      | ⋮      |
| WL33 | Vread  | Vread6 | 0V     | Vread6 |
| WL32 | Vread6 | Vread  | Vread6 | 0V     |
| WL31 | 0V     | Vread6 | Vread  | Vread6 |
| WL30 | Vread6 | 0V     | Vread6 | Vread  |
| ⋮    | ⋮      | ⋮      | ⋮      | ⋮      |
| WL3  | 0V     | Vread6 | Vread  | Vread6 |
| WL2  | Vread6 | 0V     | Vread6 | Vread  |
| WL1  | Vread  | Vread6 | 0V     | Vread6 |
| WL0  | Vread6 | Vread  | Vread6 | 0V     |

FIRST ERASE VERIFICATION OPERATION

SECOND ERASE VERIFICATION OPERATION

THIRD ERASE VERIFICATION OPERATION

FOURTH ERASE VERIFICATION OPERATION

FIG. 31

|      | 1st    | 2nd    | 3rd    | 4th    |
|------|--------|--------|--------|--------|
| WLD  | Vread2 | Vread2 | Vread2 | Vread2 |
| WL63 | 0V     | Vread6 | Vread  | Vread6 |
| WL62 | Vread6 | 0V     | Vread6 | Vread  |
| WL61 | Vread  | Vread6 | 0V     | Vread6 |
| WL60 | Vread6 | Vread  | Vread6 | 0V     |
| :    | :      | :      | :      | :      |
| WL33 | Vread  | Vread6 | 0V     | Vread6 |
| WL32 | Vread6 | Vread  | Vread6 | 0V     |
| WL31 | 0V     | Vread6 | Vread  | Vread6 |
| WL30 | Vread6 | 0V     | Vread6 | Vread  |
| :    | :      | :      | :      | :      |
| WL3  | 0V     | Vread6 | Vread  | Vread6 |
| WL2  | Vread6 | 0V     | Vread6 | Vread  |
| WL1  | Vread  | Vread6 | 0V     | Vread6 |
| WL0  | Vread6 | Vread  | Vread6 | 0V     |
| WLS  | Vread3 | Vread3 | Vread3 | Vread3 |

FIG. 34

| | ON-CHARAC-TERISTICS OF CELL USEL | UPPER LIMIT (X) OF Vth DISTRIBUTION IN ERASED STATE (ERASE ACCURACY OF CELL SEL) | LOWER LIMIT (Y) OF Vth DISTRIBUTION IN WRITTEN STATE | OPERATION TIME AND ACCURACY | POINT WHERE LARGE STRESS IS APPLIED IN GATE INSULATING FILM OF CELL |
|---|---|---|---|---|---|
| Vread ≦ Vread4 | GOOD | HIGH | LOWER LIMIT NEEDS TO BE INCREASED | IMPROVED | BETWEEN CHARGE STORAGE LAYER AND SUBSTRATE |
| Vread 4 ≦ Vread | BAD | LOW | LOWER LIMIT CAN BE REDUCED | DETERIORATED | BETWEEN CHARGE STORAGE LAYER AND W |

NON-VOLATILE SEMICONDUCTOR STORAGE DEVICE AND MEMORY SYSTEM

CROSS-REFERENCE TO RELATED APPLICATIONS

This application is based upon and claims the benefit of priority from Japanese Patent Application No. 2008-097752, filed Apr. 4, 2008, the entire contents of which are incorporated herein by reference.

BACKGROUND

1. Field

The present invention relates to a non-volatile semiconductor storage device, and more particularly, to a non-volatile semiconductor storage device including memory strings each having non-volatile memory cells connected in series to each other and a memory system using the non-volatile semiconductor storage device.

2. Description of the Related Art

With an improvement in microfabrication technology, the length or width of a gate of a memory cell in a non-volatile semiconductor storage device, such as a NAND flash memory, has been significantly reduced. However, it is difficult to reduce the thickness of a gate insulating film of the memory cell in terms of the data storage reliability of the memory cell or voltage tolerance to data write and erase operations. As a result, when the memory cell is miniaturized, the amount of cell current flowing through the memory cell is reduced. In addition, in the NAND flash memory, with an increase in memory capacity, in a memory string having a plurality of memory cells connected in series to each other, the number of memory cells connected in series to each other tends to increase, and the amount of cell current flowing through the memory cell is decreased.

As described above, when the amount of cell current flowing through the memory cell is reduced, it is difficult to charge a bit line BL connected to each memory string within a predetermined time during an erase verification operation that verifies the erase state of the memory cell, even when data has been erased from all the memory cells in the memory string.

Further, in the NAND flash memory, when the memory cell is miniaturized and the capacity thereof is increased, there is a large difference in write characteristics between memory cells arranged at both ends of the memory string and at the middle of the memory string. JP-A-2005-235260 discloses a NAND flash memory that unifies the write characteristics. In the NAND flash memory, memory cells adjacent to a bit-line-side select gate and a source-side select gate connected to both ends of a memory string are used as dummy cells and a plurality of memory cells are connected between the two dummy cells. Since the dummy cells do not store information, the dummy cells are treated as non-selection cells during write and read operations all the time. The dummy cells make it possible to perform the write operation on the memory cells interposed between the dummy cells under the uniform bias conditions.

Furthermore, in the NAND flash memory, when the cell current is reduced due to the miniaturization of the memory cell, the low-voltage margin of the memory cell is reduced, which causes an erase fail during an erase verification operation. JP-A-2006-54036 discloses an erase scheme and a non-volatile memory device that prevent the erase fail during the erase verification operation. In the erase scheme and the non-volatile memory device, a first read voltage is applied to some memory cells in a memory string during the erase verification operation, and a second read voltage that is higher than the first read voltage is applied to the other memory cells. In this state, a first erase verification operation is performed. In addition, the second read voltage is applied to some memory cells, and the first read voltage is applied to the other memory cells. In this state, a second erase verification operation is performed. In this way, the reliability of the erase verification operation is improved.

SUMMARY OF THE INVENTION

According to an aspect of the present invention, there is provided a non-volatile semiconductor storage device including: a memory cell array including a plurality of memory strings, each of the memory strings having: a first end; a second end; and a plurality of memory cells connected in series between the first end and the second end, the memory cells being categorized into at least two memory cell groups; a first end that is one end of the memory string; and a second end that is the other end of the memory string; a plurality of first selection transistors connected to the respective first ends of the memory strings; a plurality of second selection transistors connected to the respective second ends of the memory strings; a plurality of bit lines connected to the respective second selection transistors; a plurality of word lines connected to the memory cells; and a control circuit configured to apply different control voltages to the respective word lines so that the same voltage is applied to the memory cells belonging to the same memory cell group when an erase verification is performed on the memory cell array, wherein any one of the memory cells and the adjacent memory cells belongs to different groups.

According to another aspect of the present invention, there is provided a memory system including: a non-volatile semiconductor storage device including: a memory cell array including a plurality of memory strings, each of the memory strings having: a plurality of memory cells connected in series and categorized into at least two memory cell groups; a first end that is one end of the memory string; and a second end that is the other end of the memory string; a plurality of first selection transistors connected to the respective first ends; a plurality of second selection transistors connected to the respective second ends; a plurality of bit lines connected to the respective second selection transistors; a plurality of word lines connected to the respective memory cells; and a control circuit configured to apply different control voltages to the respective word lines so that the same voltage is applied to the memory cells belonging to the same memory cell group when an erase verification is performed on the memory cell array; and a controller including: a counter that counts the number of accesses to the memory cell array; and a setting unit configured to determine the number of the memory cell groups based on the number of accesses counted by the counter, wherein any one of the memory cells and the adjacent memory cells belongs to different groups.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 3A is an equivalent circuit diagram illustrating a memory string according to the first embodiment, and FIG. 3B is a diagram illustrating an example of voltages applied to the memory string during an erase verification operation.

FIG. 7 is a diagram illustrating an example of erase verification voltages applied to divided memory cell groups during the erase verification operation according to the first embodiment.

FIG. 8A is an equivalent circuit diagram illustrating the state of a voltage applied during the first erase verification operation according to the first embodiment, and FIG. 8B is an equivalent circuit diagram illustrating the state of a voltage applied during the second erase verification operation according to the first embodiment.

FIG. 11 is a diagram illustrating an example of the erase verification voltages applied to divided memory cell groups during the erase verification operation according to the second embodiment.

FIG. 14 is a diagram illustrating an example of the erase verification voltages applied to divided memory cell groups during the erase verification operation according to the third embodiment.

FIG. 17 is a diagram illustrating an example of the erase verification voltages applied to the divided memory cell groups during the erase verification operation according to the third embodiment.

FIG. 20 is a diagram illustrating an example of erase verification voltages applied to divided memory cell groups during the erase verification operation according to the fourth embodiment.

FIG. 21 is a timing chart illustrating the erase verification voltages applied to the memory cell groups during the erase verification operation according to the fourth embodiment.

FIG. 23 is a diagram illustrating an example of the erase verification voltages applied to the divided memory cell groups during the erase verification operation according to the fourth embodiment.

FIG. 27 is a diagram illustrating an example of the erase verification voltages applied to divided memory cell groups during the erase verification operation according to the fifth embodiment.

FIG. 31 is a diagram illustrating an example of the erase verification voltages applied to the divided memory cell groups during the erase verification operation according to the fifth embodiment.

FIG. 34 is a diagram showing characteristics of the memory cell with respect to relationship between Vread and Vread4.

DETAILED DESCRIPTION

Figure 1:
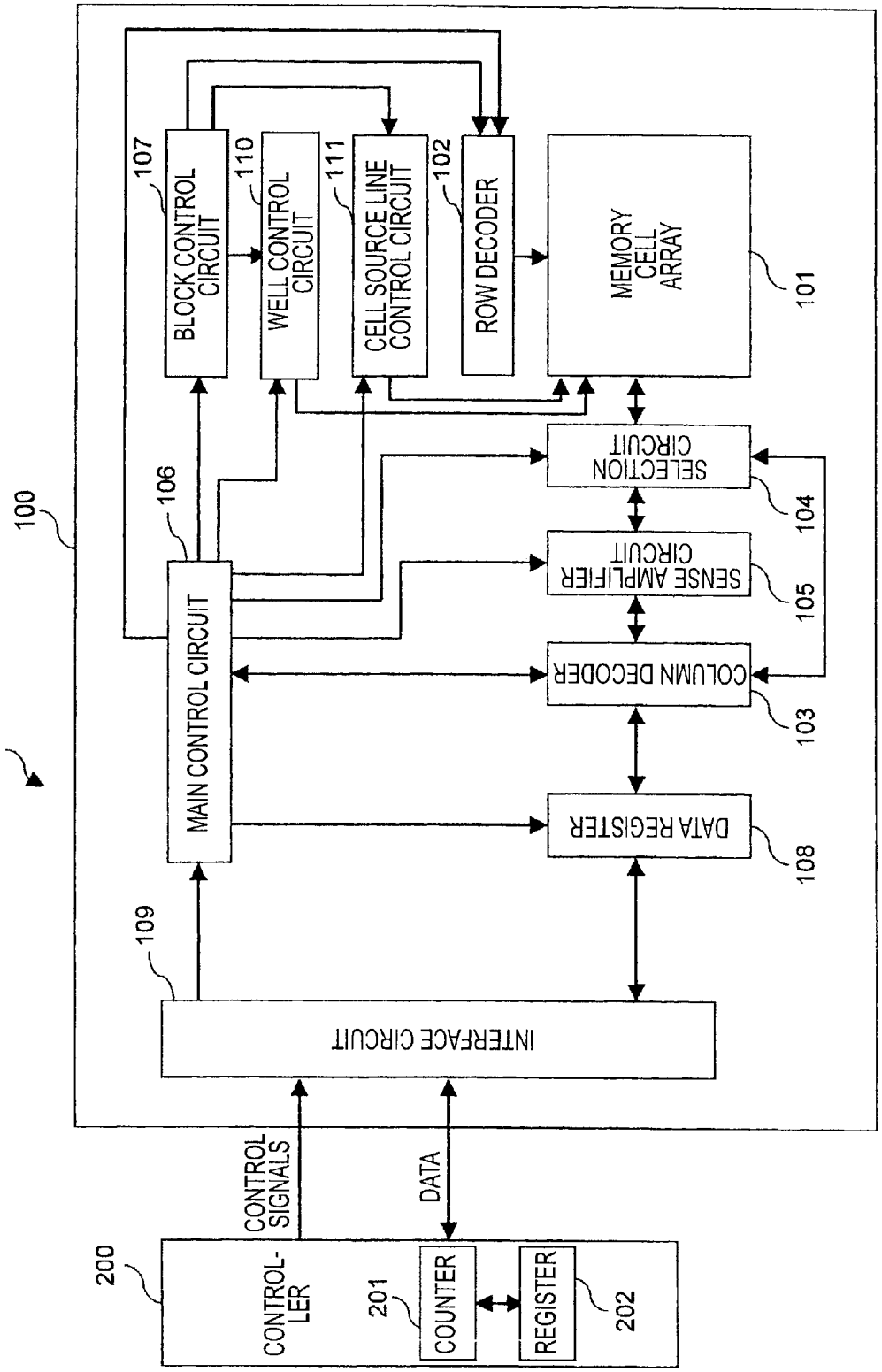
FIG. 1 is a diagram illustrating an example of the overall structure of a memory system according to a first embodiment.

Hereinafter, exemplary embodiments of the invention will be described with reference to the accompanying drawings. A NAND flash memory is given as an example of a non-volatile semiconductor storage device according to the embodiments of the invention. In the following embodiments, the same components are denoted by the same reference numerals, and a description thereof will be omitted.

First Embodiment

FIG. 1 is a diagram illustrating the overall structure of a memory system 1 using a NAND flash memory 100 according to a first embodiment of the invention. The memory system 1 includes the NAND flash memory 100 and a controller 200. The NAND flash memory 100 includes a memory cell array 101, a row decoder 102, a column decoder 103, a selection circuit 104, a sense amplifier circuit 105, a main control circuit 106, a block control circuit 107, a data register 108, an interface circuit 109, a well control circuit 110, and a cell source line control circuit 111.

Figure 2:
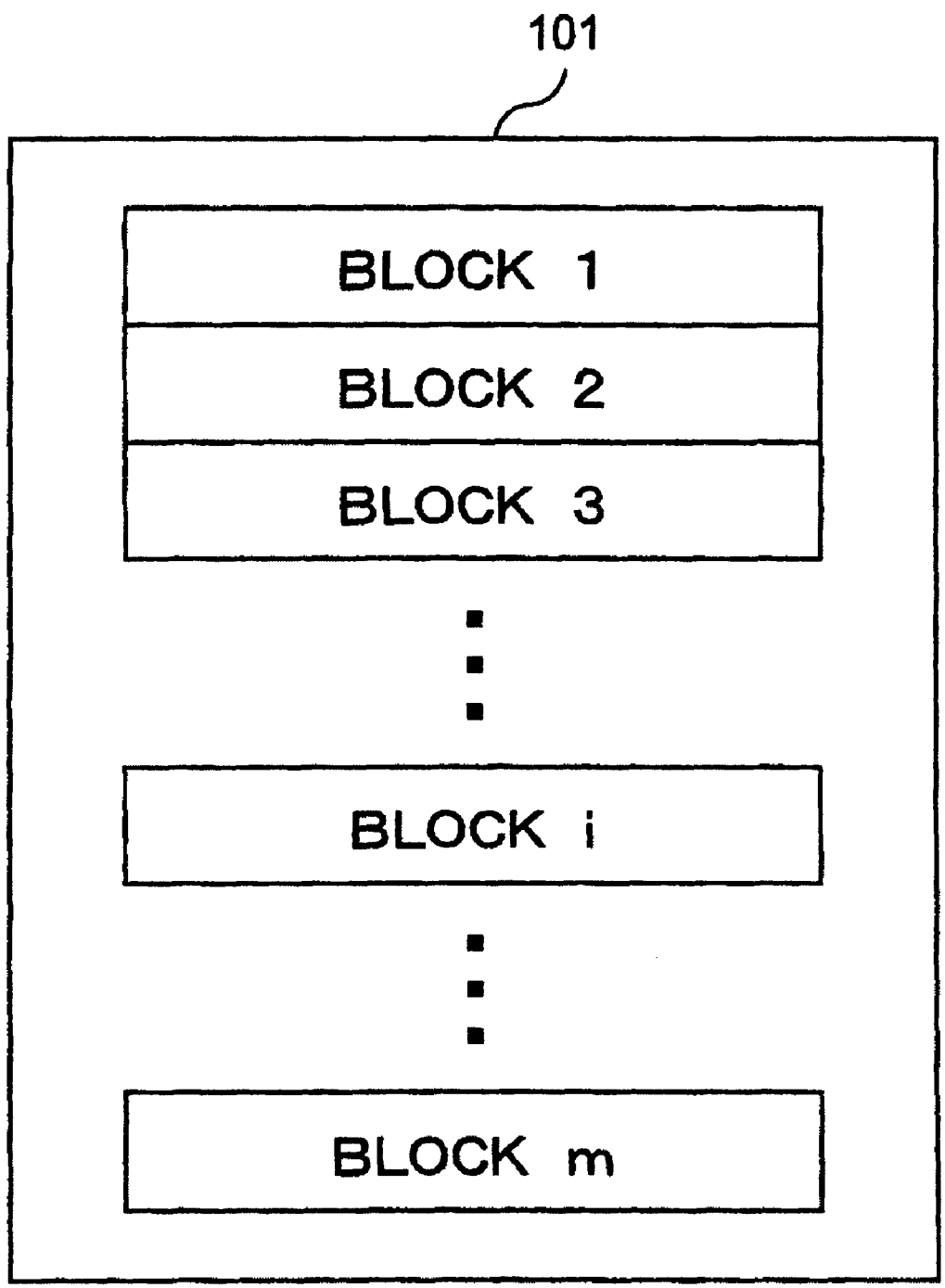
FIG. 2 is a diagram illustrating an example of the structure of blocks in a memory cell array according to the first embodiment.

The memory cell array 101 includes memory strings arranged in a matrix, and each of the memory strings is formed by connecting a source-side selection gate transistor, a plurality of memory cells, and a drain-side selection gate transistor in series. FIG. 2 is a diagram illustrating an example of the structure of blocks in the memory cell array 101. As shown in FIG. 2, the memory cell array 101 includes m divided blocks BLOCK1, BLOCK2, BLOCK3, . . . , BLOCKi, . . . , BLOCKm. The term 'block' is a minimum unit for collectively erasing data. The blocks BLOCK1, BLOCK2, BLOCK3, . . . , BLOCKi, . . . , BLOCKm each have a plurality of memory strings, which will be described below, and have the same structure.

FIG. 3A is a diagram illustrating an example of the structure of the memory string. The memory string shown in FIG. 3A includes a source-side selection gate transistor (first selection transistor) SGS that is connected to a common source line CELSRC, a drain-side selection gate transistor (second selection transistor) SGD that is connected to a bit line BL, and a plurality of memory cells M0, M1, . . . , Mk, Mk+1, . . . , Mn-1, and Mn. The gate terminals of the memory cells M0, M1, . . . , Mk, Mk+1, . . . , Mn-1, and Mn are connected to word lines WL0, WL1, . . . , WLk, WLk+1, . . . , WLn-1, and WLn, respectively. In the memory string, n memory cells are connected in series to each other.

The interface circuit 109 is connected to an external controller 200, and transmits or receives data and control signals (for example, various commands, address information, and clock signals) to or from the controller 200. The interface circuit 109 performs a predetermined process on the data and the control signals received from the controller 200, and outputs the processed results to the main control circuit 106 and the data register 108.

The main control circuit 106 controls the row decoder 102, the column decoder 103, the selection circuit 104, the sense amplifier circuit 105, the block control circuit 107, and the data register 108 on the basis of the control signals input from the interface circuit 109. The main control circuit 106 respectively outputs a row address and a column address included in address information to the row decoder 102 and the column decoder 103 to control a data read operation, a data write operation, or a data erase operation performed on the memory cells. In addition, the main control circuit 106 stores a control program that controls an erase verification operation, and controls the erase verification operation of the row decoder 102 on the basis of the control program. When the erase verification operation is performed, the main control circuit 106 divides a plurality of memory cells in the memory string into memory cell groups according to the connection positions of the word lines WL, and controls the row decoder 102 to control the voltage level of an erase verification voltage applied to the word lines WL in each of the divided memory cell groups or the number of times the erase verification voltage is applied. Further, the main control circuit 106 changes the number of divided memory cell groups in the memory string on the basis of a division setting number input from the controller 200 through the interface circuit 109, and changes the voltage level of the erase verification voltage or the number of times the erase verification voltage is applied on the basis of the number of divided memory cell groups.

The row decoder 102 selects the word line WL connected to a memory cell to be operated in the memory cell array 101 on the basis of the row address input from the main control circuit 106, and applies a voltage related to the data read operation, the data write operation, or the data erase operation to the selected word line WL. In addition, during an erase verification operation, the row decoder 102 divides a plurality of memory cells in the memory string into memory cell groups, and controls the voltage level of the erase verification voltage applied to the word lines WL in each of the divided memory cell groups or the number of times the erase verification voltage is applied, under the control of the main control circuit 106.

The column decoder 103 controls the sense amplifier circuit 105 and the selection circuit 104 on the basis of the column address and data input from the main control circuit 106, selects a bit line BL connected to a memory string to be operated in the memory cell array 101, and performs the data read operation, the data write operation, or the data erase operation on the selected bit line BL.

The sense amplifier circuit 105 includes a plurality of sense amplifiers (not shown), and each of the sense amplifiers is connected to the corresponding bit line BL in the memory cell array 101 through the selection circuit 104. The sense amplifier circuit 105 supplies data to the bit line BL connected to a memory string to be operated through the selection circuit 104, and detects and holds the potential of the bit line BL, under the control of the column decoder 103.

The data register 108 holds write data input from the interface circuit 109, and outputs the write data to the column decoder 103, under the main control circuit 106. In addition, the data register 108 holds read data input from the column decoder 103, and outputs the read data to the interface circuit 109, under the main control circuit 106.

The block control circuit 107 outputs a control signal for selecting a block to be operated in the memory cell array 101 to the row decoder 102, on the basis of the address information input from the main control circuit 106, and controls the write operation, the read operation, and the erase operation performed on the selected block.

The well control circuit 110 is provided to control the voltage of a substrate region in which the memory cell array 101 is formed. The well control circuit 110 controls the potential of the substrate region during the data read operation and the data write operation, under the control of the main control circuit 106.

The cell source line control circuit 111 controls a voltage applied to the common source line CELSRC according to the data read operation, the data write operation, or the data erase operation, under the control of the main control circuit 106.

The controller 200 transmits or receives data and control signals (for example, various commands, address information, and clock signals) related to the read operation, the write operation, or the erase operation to or from the interface circuit 109. In addition, the controller 200 includes a counter 201 and a register 202. The counter 201 counts the number of accesses to the NAND flash memory 100. The register 202 (division number setting unit) stores a plurality of division setting numbers that are set by associating the number of accesses with the number of divided memory cell groups. The controller 200 compares the count value of the counter 201 with the number of accesses that is set in the register 202, and outputs the division setting number set in the register 202 to the interface circuit 109 whenever the count value reaches the number of accesses.

Next, the basic operation of erase verification performed in the NAND flash memory 100 will be described with reference to an equivalent circuit of the memory string shown in FIG. 3. FIG. 3A is an equivalent circuit diagram illustrating the memory string, and FIG. 3B is a diagram illustrating an example of a voltage applied during an erase verification operation.

The memory string shown in FIG. 3A includes the drain-side selection gate transistor SGD that is connected to the bit line BL, a plurality of memory cells M0, M1, ..., Mn having gate terminals respectively connected to the word lines WL0, WL1, ..., WLn, and the source-side selection gate transistor SGS that is connected to the common source line CELSRC.

Next, an erase verification process performed on the memory string will be described with reference to FIG. 3B.

First, a voltage Vdd is applied to the common source line CELSRC, and the common source line is charged with the voltage. In addition, a voltage of 0 V is applied to the selected bit line BL to be in a floating state. Then, a voltage Vread is applied to the gate terminal of the source-side selection gate transistor SGS, a voltage of 0 V is applied to each of the gate terminals of the memory cells M0, M1, ..., Mn, and the voltage Vread is applied to the gate terminal of the drain-side selection gate transistor SGD. In this case, when data of all the memory cells M0, M1, ..., Mn has been erased, a voltage is applied from the common source line CELSRC to the bit line BL through the memory cells M0, M1, ..., Mn, and the potential of the bit line BL is increased. In FIG. 3B, the increased potential of the bit line BL is represented by Vtcell. On the other hand, when data of all the memory cells M0, M1, ..., Mn has not been erased, the potential of the selected bit line BL is maintained at a level of about 0 V. Then, the sense amplifier circuit 105 detects the potential of the bit line BL, and it is determined whether data is completely erased from the memory string on the basis of the level of the potential.

In the above case, a voltage of 0 V is applied to the gate terminals. However, not only the voltage 0 V but also a voltage higher than 0 V which is able to confirm the erasure state may be applied to the gate terminals. Henceforth, the voltage applied to the gate electrode to confirm the erasure state is assumed as 0V for simplifying.

When some of the bit lines are selected as the selected bit lines, the other bit lines are regarded as non-selected bit lines. The selected bit lines are configured to be disposed next to the non-selected bit lines. Therefore, the selected bit lines are shielded from mutual interference between each selected bit lines by the non-selected bit line charged with Vdd.

In the NAND flash memory, with an improvement in microfabrication technology, the length and width of a gate of a memory cell have been significantly decreased. With the reduction in the length and width of the gate, a cell current flowing through the memory cell has been reduced. In addition, with an increase in the capacity of a memory cell array, the number of memory cells connected in series to each other in a memory string has increased. In this case, the cell current is also decreased. The reduction in the cell current due to the reduction in the length and width of the gain and the increase in the capacity of the memory cell array makes it difficult to charge the bit line BL within a desired time even when all the memory cells in the memory string are in an erased state during the erase verification operation.

For example, as measures for charging the bit line BL when the cell current is reduced, the following methods may be used: a method of increasing the voltage level of an erase verification voltage applied to the word line WL; and a method of increase the charge time of a voltage applied from the common source line CELSRC to the bit line BL. However, these measures deteriorate a voltage detecting performance during the erase verification operation. Therefore, measures for improving the accuracy of the erase verification operation are needed.

Figure 4A:
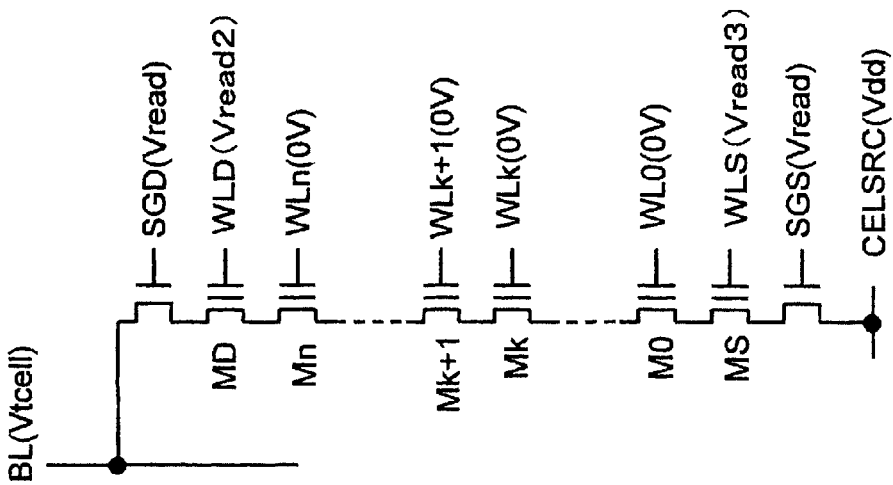
FIG. 4A is an equivalent circuit diagram illustrating a memory string including dummy cells according to the first embodiment.
Figure 4B:
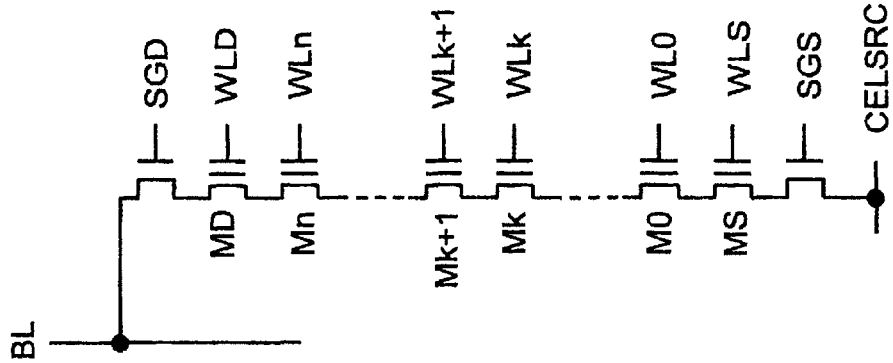
FIG. 4B is a diagram illustrating an example of voltages applied to the memory string during the erase verification operation according to the first embodiment.

In addition, as measures for charging the bit line BL when the cell current is reduced, for example, the following method may be used: in a memory string, memory cells adjacent to the source-side selection gate transistor SGS and the drain-side selection gate transistor SGD serve as dummy cells that are not used as storage elements. FIG. 4 shows an equivalent circuit of the memory string when the dummy cells are used. FIG. 4A is an equivalent circuit diagram illustrating the memory string using the dummy cells, and FIG. 4B is a diagram illustrating an example of a voltage applied during the erase verification operation.

In the memory string shown in FIG. 4A, memory cells adjacent to the source-side selection gate transistor SGS and the drain-side selection gate transistor SGD are used as dummy cells MS and MD, and dummy word lines WLS and WLD are connected to the gate terminals of the dummy cells MS and MD, respectively. In the memory string, an erase operation is performed, but a write operation is not operated. Therefore, during the erase verification operation, an erase verification voltage applied to the dummy word lines WLS and WLD may be equal to or lower than the voltage Vread. FIG. 4B shows a case in which voltages Vread3 and Vread2 are respectively applied to the dummy word lines WLS and WLD during the erase verification operation. In this case, in general, it is preferable that the voltages satisfy Vread3≦Vread2≦Vread. The reason is that, when the erase verification voltage Vread2 is set to be higher than the erase verification voltage Vread3 during the erase verification operation, a charge performance with respect to the bit line BL is improved.

In the first embodiment, the erase state of the memory string is not determined after only one erase verification operation, but at least two or more different erase verification operations are performed to determine the erase state. In addition, in each erase verification operation, the voltage level of an erase verification voltage applied to the word lines WL in each of the memory cell groups divided from a plurality of memory cells or the number of times the erase verification voltage is applied is examined. These measures can shorten the charge time of a voltage applied to the bit line BL and improve the accuracy of the erase verification operation. The erase verification operation implementing these measures will be described below.

The process of the main control circuit 106 during the erase verification operation will be described with reference to a flowchart shown in FIG. 5, an equivalent circuit of the memory string shown in FIG. 6, and an example of the erase verification voltage applied to each memory cell group shown in FIG. 7.

Figure 5:
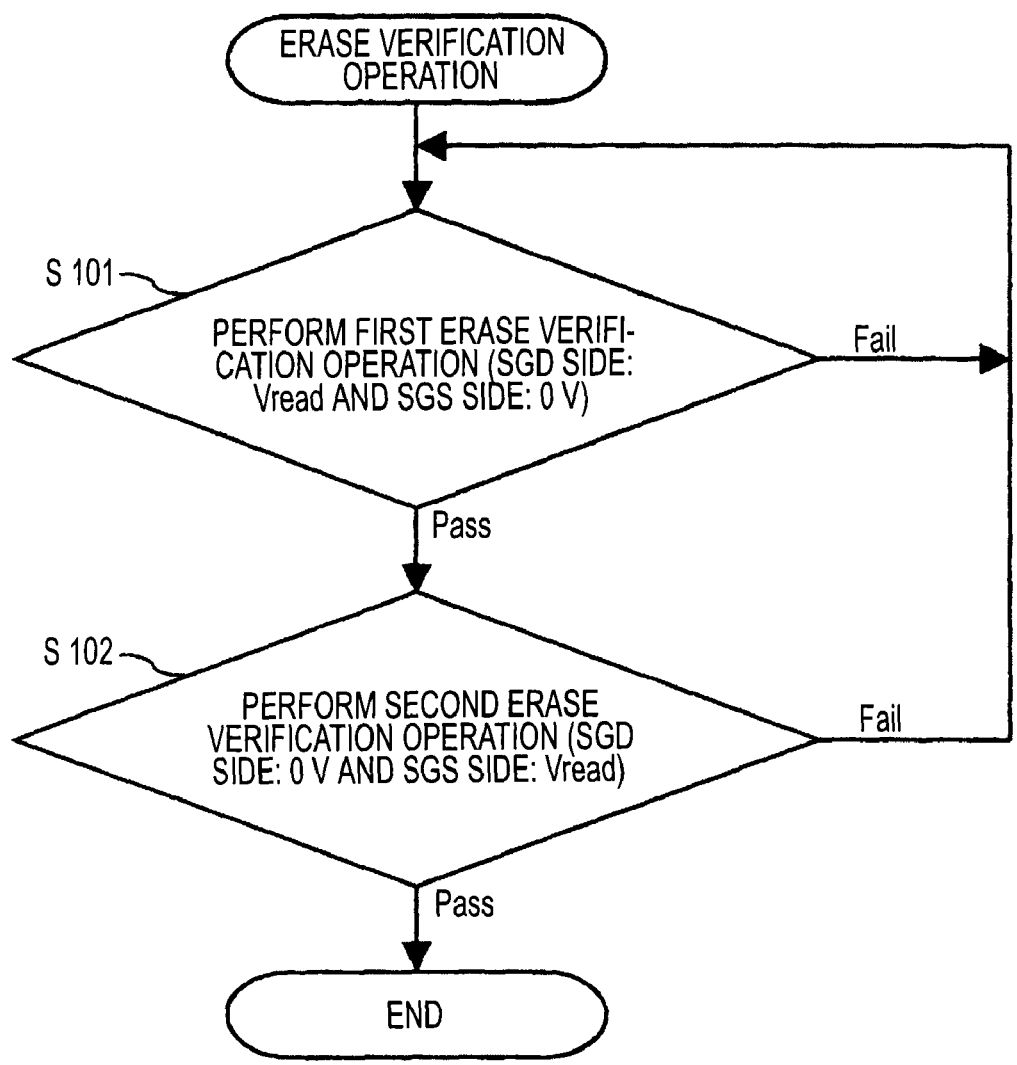
FIG. 5 is a flowchart illustrating the process of a main control circuit during the erase verification operation according to the first embodiment.

It is assumed that, during the erase verification operation, the main control circuit 106 according to the first embodiment performs the process shown in FIG. 5. In this process, a plurality of memory cells in a memory string are divided into a memory cell group including half the memory cells close to the drain-side selection gate transistor SGD and a memory cell group including half the memory cells close to the source-side selection gate transistor SGS, and two different erase verification operations are performed on each of the memory cell groups.

In FIG. 5, the main control circuit 106 performs a first erase verification operation (Step S101). In this case, first, the main control circuit 106 applies a voltage Vdd to the common source line CELSRC. In addition, the main control circuit 106 applies a voltage of 0 V to the selected bit line BL to be in a floating state. Then, the main control circuit 106 applies the erase verification voltage Vread to the word lines WL of the memory cell group including half the memory cells close to the drain-side selection gate transistor SGD, and applies an erase verification voltage of 0 V to the word lines WL of the memory cell group including half the memory cells close to the source-side selection gate transistor SGS, thereby charging the bit line BL. Then, the sense amplifier circuit 105 detects the potential of the bit line BL, and it is determined whether data is completely erased from the memory string on the basis of the level of the potential.

Then, the main control circuit 106 performs a second erase verification operation (Step S102). In this case, first, the main control circuit 106 applies the voltage Vdd to the common source line CELSRC. In addition, the main control circuit 106 applies a voltage of 0 V to the selected bit line BL to be in a floating state. Then, the main control circuit 106 applies an erase verification voltage of 0 V to the word lines WL of the memory cell group including half the memory cells close to the drain-side selection gate transistor SGD, and applies the erase verification voltage Vread to the word line WL of the memory cell group including half the memory cells close to the source-side selection gate transistor SGS, thereby charging the bit line BL. Then, the sense amplifier circuit 105 detects the potential of the bit line BL, and it is determined whether data is completely erased from the memory string on the basis of the level of the potential.

Figure 6A:
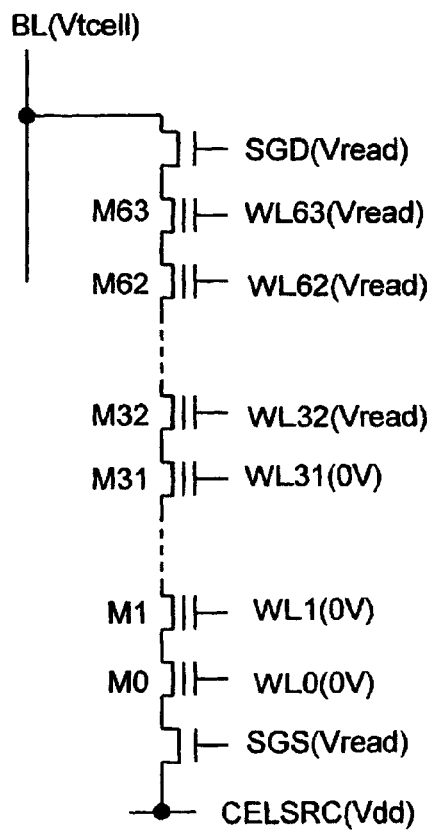
FIG. 6A is an equivalent circuit diagram illustrating the state of a voltage applied during a first erase verification operation according to the first embodiment.
Figure 6B:
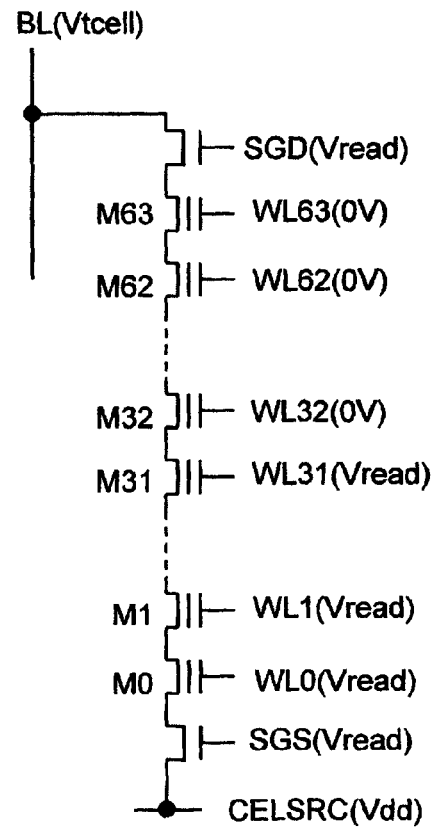
FIG. 6B is an equivalent circuit diagram illustrating the state of a voltage applied during a second erase verification operation according to the first embodiment.

FIGS. 6A and 6B are equivalent circuit diagrams illustrating the states of the erase verification voltages applied to the divided memory cell groups in the memory string when the above-mentioned process is performed. FIG. 6A is a diagram illustrating the state of the erase verification voltage applied during the first erase verification operation. FIG. 6B is a diagram illustrating the state of the erase verification voltage applied during the second erase verification operation. In the equivalent circuit of the memory string, 64 memory cells M0 to M63 are connected in series to each other, and the word lines WL0 to WL63 are connected to the gate terminals of the memory cells M0 to M63, respectively.

During the first erase verification operation shown in FIG. 6A, the voltage Vdd is applied to the common source line CELSRC, the voltage Vread is applied to the drain-side selection gate transistor SGD, and the erase verification voltage Vread is applied to the word lines WL32 to WL63 of a memory cell group including the memory cells M32 to M63 close to the drain-side selection gate transistor SGD. In addition, the voltage Vread is applied to the source-side selection gate transistor SGS, and an erase verification voltage of 0 V is applied to the word lines WL0 to WL31 of a memory cell group including the memory cells M0 to M31 close to the source-side selection gate transistor SGS.

During the second erase verification operation shown in FIG. 6B, an erase verification voltage of 0 V is applied to the word lines WL32 to WL63 of the memory cell group including the memory cells M32 to M63, which are half all the memory cells, close to the drain-side selection gate transistor SGD, and the erase verification voltage Vread is applied to the word lines WL0 to WL31 of the memory cell group including the memory cells M0 to M31 close to the source-side selection gate transistor SGS.

The states of the voltages applied during the first and second erase verification operations shown in FIGS. 6A and 6B are shown as '1st' and '2nd' in a table of FIG. 7, respectively. As such, it is possible to improve the charge performance of the voltage applied from the common source line CELSRC to the bit line BL through the memory cell groups during each erase verification operation (1st and 2nd shown in FIG. 7) by dividing a plurality of memory cells in the memory string into a memory cell group close to the drain-side selection gate transistor SGD and a memory cell group close to the source-side selection gate transistor SGS, and performing two different erase verification operations on each of the memory cell groups to control the voltage level of the erase verification voltage. As a result, it is possible to improve the accuracy of the erase verification operation.

During the erase verification operation shown in FIGS. 5 to 7, a plurality of memory cells in the memory string are divided into a memory cell group close to the drain-side selection gate transistor SGD and a memory cell group close to the source-side selection gate transistor SGS. In this case, in some memory cells (memory cells M31 and M32 in FIG. 6) adjacent to the division boundary between the divided memory cell groups, there is a potential difference between the erase verification voltages Vread and 0 V applied to the word lines WL31 and WL32. Therefore, the accuracy of the erase verification operation is likely to be lowered due to the potential difference between the erase verification voltages of the memory cells adjacent to the division boundary.

In order to reduce the influence of the potential difference between the erase verification voltages of the memory cells adjacent to the division boundary, an erase verification voltage of 0 V may be applied to the memory cells adjacent to the division boundary. An example of the erase verification voltage is represented by a field 'reduction in influence of potential difference on adjacent word lines' in the table of FIG. 7. In this case, during the first erase verification operation (1st), the erase verification voltage Vread is applied to the word lines WL33 to WL63 of a memory cell group including the memory cells M33 to M63 close to the drain-side selection gate transistor SGD, and an erase verification voltage of 0 V is applied to the word lines WL0 to WL32 of a memory cell group including the memory cells M0 to M32 close to the source-side selection gate transistor SGS. In addition, during the second erase verification operation (2nd), an erase verification voltage of 0 V is applied to the word lines WL31 to WL63 of a memory cell group including the memory cells M31 to M63 close to the drain-side selection gate transistor SGD, and the erase verification voltage Vread is applied to the word lines WL0 to WL30 of a memory cell group including the memory cells M0 to M30 close to the source-side selection gate transistor SGS.

In FIG. 7, as shown in the field 'reduction in influence of potential difference on adjacent word lines', when an erase verification voltage of 0 V is applied to the memory cells M33 and M32 adjacent to the division boundary during the first erase verification operation (1st) and the second erase verification operation (2nd), it is possible to reduce the influence of the potential difference between the erase verification voltages of the memory cells and prevent a reduction in the accuracy of the erase verification operation.

When two different erase verification operations are performed on the memory string shown in FIG. 4 in which the memory cells adjacent to the source-side selection gate transistor SGS and the drain-side selection gate transistor SGD serve as the dummy cells MS and MD, the erase verification voltages shown in FIGS. 8A and 8B are applied.

During the first erase verification operation shown in FIG. 8A, the voltage Vdd is applied to the common source line CELSRC, the voltage Vread is applied to the drain-side selection gate transistor SGD, and the voltage Vread2 is applied to the dummy cells MS and MD. In addition, the erase verification voltage Vread is applied to the word lines WL32 to WL63 of the memory cell group including the memory cells M32 to M63, which are half all the memory cells, close to the drain-side selection gate transistor SGD, the voltage Vread is applied to the source-side selection gate transistor SGS, and an erase verification voltage of 0 V is applied to the word lines WL0 to WL31 of the memory cell group including the memory cells M0 to M31, which are half all the memory cells, close to the source-side selection gate transistor SGS.

During the second erase verification operation shown in FIG. 8B, the voltage Vread is applied to the drain-side selection gate transistor SGD, the voltages Vread3 and Vread2 are applied to the dummy word lines WLS and WLD of the dummy cells MS and MD, respectively, and an erase verification voltage of 0 V is applied to the word lines WL32 to WL63 of the memory cell group including the memory cells M32 to M63, which are half all the memory cells, close to the drain-side selection gate transistor SGD. In addition, the voltage Vread is applied to the source-side selection gate transistor SGS, and the erase verification voltage Vread is applied to the word lines WL0 to WL31 of the memory cell group including the memory cells M0 to M31, which are half all the memory cells, close to the source-side selection gate transistor SGS. Similar to FIG. 4B, in general, it is preferable that the voltages satisfy Vread3≦Vread2≦Vread.

As such, it is possible to improve the charge performance of the voltage applied from the common source line CELSRC to the bit line BL through the memory cell groups during each erase verification operation (see 1st and 2nd shown in FIG. 7) by dividing a plurality of memory cells in the memory string including the dummy cells MS and MD into a memory cell group close to the drain-side selection gate transistor SGD and a memory cell group close to the source-side selection gate transistor SGS, and performing two different erase verification operations on each of the memory cell groups to control the voltage level of the erase verification voltage. As a result, it is possible to improve the accuracy of the erase verification operation.

Further, the erase verification voltage application conditions written in the field 'reduction in influence of potential difference on adjacent word lines' shown in the table of FIG. 7 are applied to the memory string including the dummy cells MS and MD shown in FIG. 8 to apply an erase verification voltage of 0 V to the memory cells M33 and M32 adjacent to the division boundary between the divided memory cell groups. In this way, it is possible to reduce the influence of the potential difference between the erase verification voltages of the memory cells and prevent a reduction in the accuracy of the erase verification operation. In this embodiment, the erase verification operation is performed on the SGS-side cells and then performed on the SGD-side cells. However, the erase verification operation may be performed on the SGD-side cells and then performed on the SGS-side cells.

Second Embodiment

In the first embodiment, a plurality of memory cells in the memory string are divided into two memory cell groups, that is, a memory cell group close to the drain-side selection gate transistor SGD and a memory cell group close to the source-side selection gate transistor SGS, and two different erase verification operations are performed on each of the two memory cell groups. However, in a second embodiment, a plurality of memory cells in a memory string are divided into three memory cell groups and three different erase verification operations are performed on each memory cell group. In addition, the overall structure of a NAND flash memory according to the second embodiment is the same as that of the NAND flash memory 100 shown in FIG. 1, and an illustration and description thereof will be omitted.

Next, the process of the main control circuit 106 in the NAND flash memory 100 during an erase verification operation will be described with reference to a flowchart shown in FIG. 9, an equivalent circuit of the memory string shown in FIG. 10, and an example of the erase verification voltage applied to each memory cell group shown in FIG. 11. In the memory string shown in FIG. 11, 64 memory cells are connected in series to each other.

Figure 9:
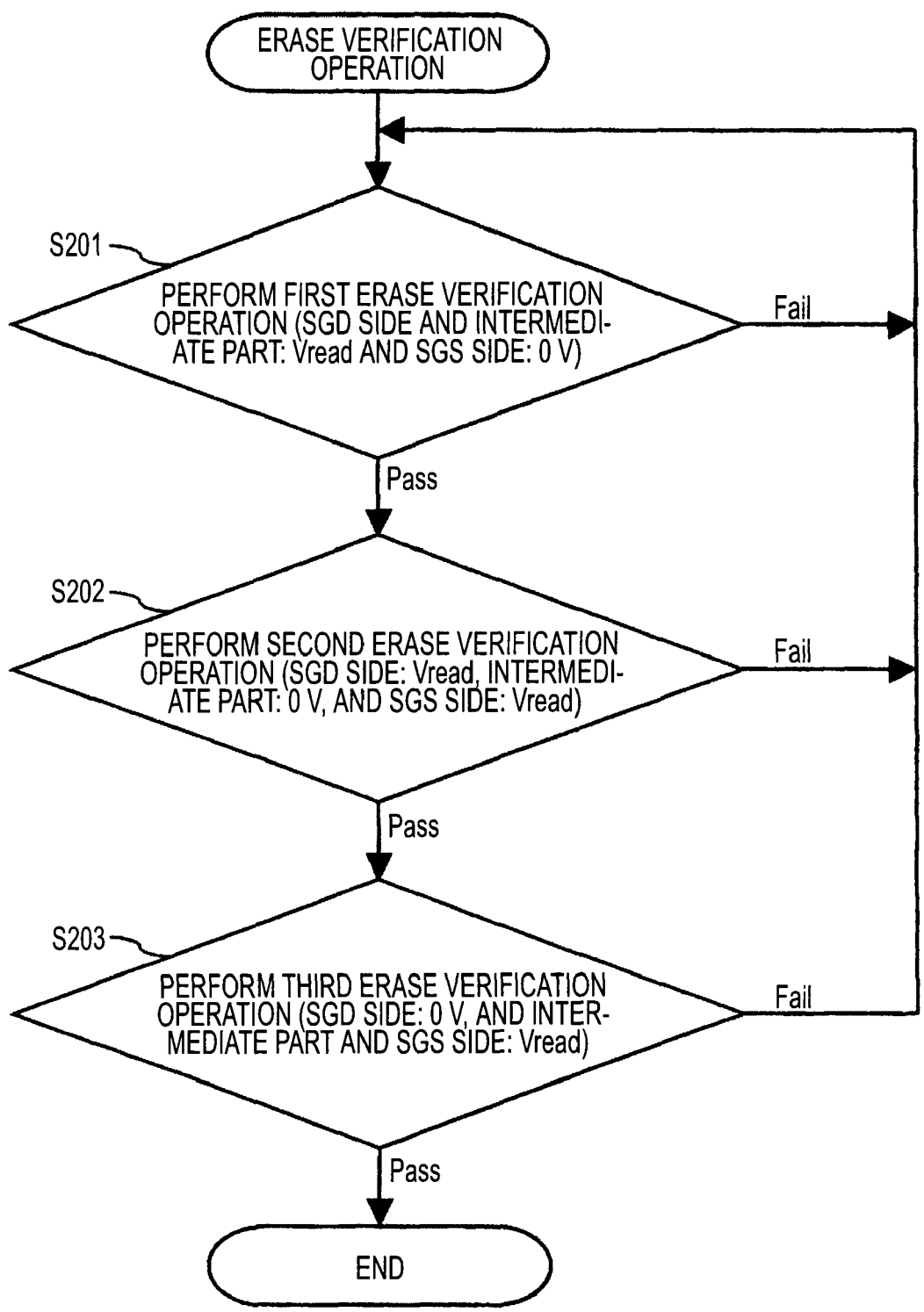
FIG. 9 is a flowchart illustrating the process of a main control circuit during an erase verification operation according to a second embodiment of the invention.
Figure 10:
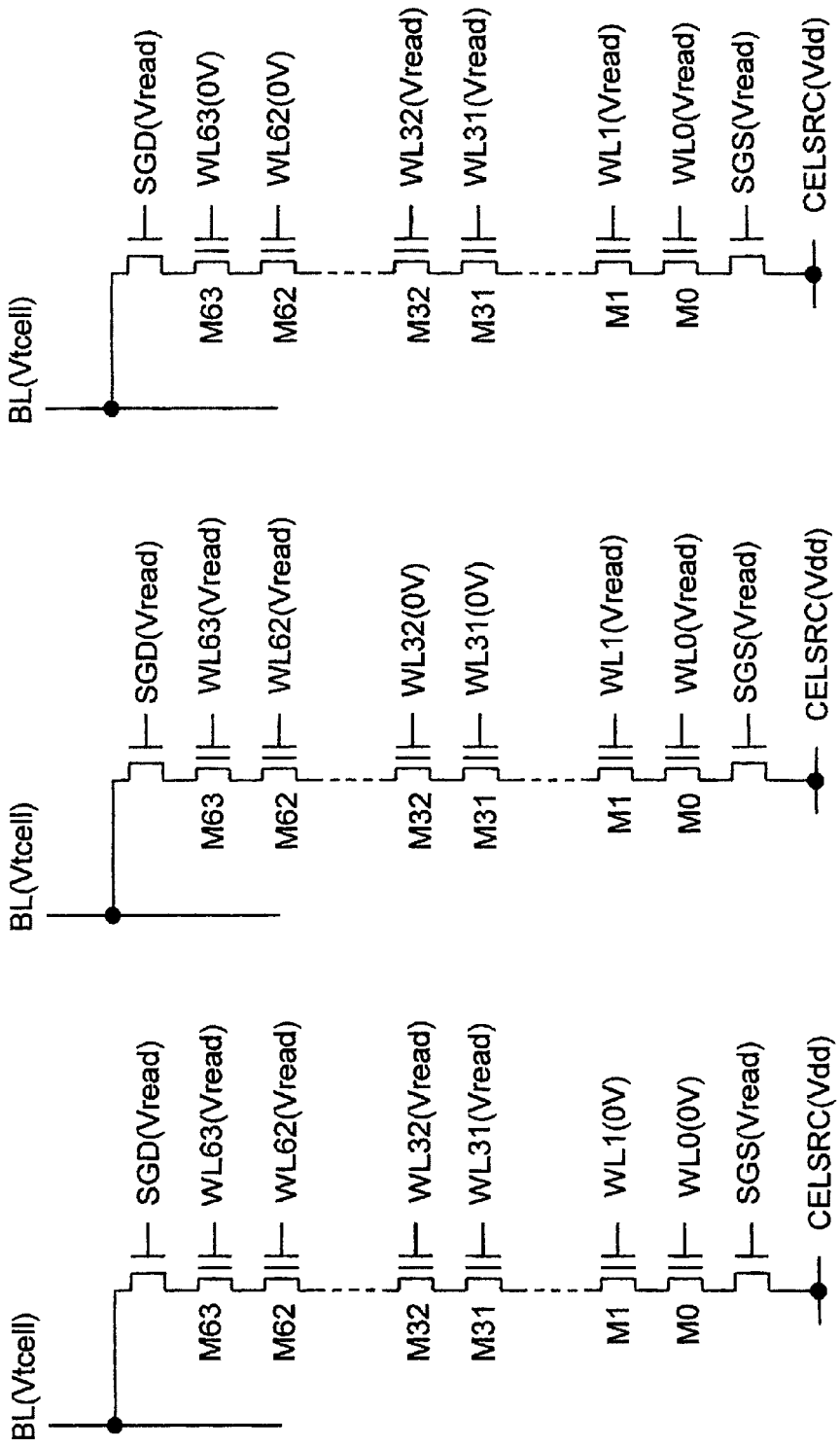
FIG. 10A is an equivalent circuit diagram illustrating the state of a voltage applied during a first erase verification operation according to the second embodiment.
FIG. 10B is an equivalent circuit diagram illustrating the state of a voltage applied during a second erase verification operation according to the second embodiment.
FIG. 10C is an equivalent circuit diagram illustrating the state of a voltage applied during a third erase verification operation according to the second embodiment.

In FIG. 9, the main control circuit 106 performs a first erase verification operation (Step S201). In this case, first, the main control circuit 106 applies the voltage Vdd to the common source line CELSRC. In addition, the main control circuit 106 applies a voltage of 0 V to the selected bit line BL to be in a floating state. Then, as shown in FIG. 10A and a field '1st' in a table of FIG. 11, the main control circuit 106 applies the erase verification voltage Vread to the word lines WL21 to WL63 of memory cell groups including the memory cells M21 to M63 corresponding to an intermediate part and about one-third of all the memory cells from the drain-side selection gate transistor SGD, and applies an erase verification voltage of 0 V to the word lines WL0 to WL20 of a memory cell group including the memory cells M0 to M20 corresponding to about one-third of all the memory cells from the source-side selection gate transistor SGS, thereby charging the bit line BL. Then, the sense amplifier circuit 105 detects the potential of the bit line BL, and it is determined whether data is completely erased from the memory string on the basis of the level of the potential.

Then, the main control circuit 106 performs a second erase verification operation (Step S202). In this case, first, the main control circuit 106 applies the voltage Vdd to the common source line CELSRC. In addition, the main control circuit 106 applies a voltage of 0 V to the selected bit line BL to be in a floating state. Then, as shown in FIG. 10B and a field '2nd' in the table of FIG. 11, the main control circuit 106 applies the erase verification voltage Vread to the word lines WL42 to WL63 of a memory cell group including the memory cells M42 to M63 corresponding to about one-third of all the memory cells from the drain-side selection gate transistor SGD, applies an erase verification voltage of 0 V to the word lines WL21 to WL41 of the intermediate memory cell group including the memory cells M21 to M41, and applies the erase verification voltage Vread to the word lines WL0 to WL20 of the memory cell group including the memory cells M0 to M20 corresponding to about one-third of all the memory cells from the source-side selection gate transistor SGS, thereby charging the bit line BL. Then, the sense amplifier circuit 105 detects the potential of the bit line BL, and it is determined whether data is completely erased from the memory string on the basis of the level of the potential.

Then, the main control circuit 106 performs a third erase verification operation (Step S203). In this case, first, the main control circuit 106 applies the voltage Vdd to the common source line CELSRC. In addition, the main control circuit 106 applies a voltage of 0 V to the selected bit line BL to be in a floating state. Then, as shown in FIG. 10C and a field '3rd' in the table of FIG. 11, the main control circuit 106 applies an erase verification voltage of 0 V to the word lines WL42 to WL63 of the memory cell group including the memory cells M42 to M63 corresponding to about one-third of all the memory cells from the drain-side selection gate transistor SGD, applies the erase verification voltage Vread to the word lines WL0 to WL41 of the memory cell groups including the memory cells M0 to M41 corresponding to the intermediate part and about one-third of all the memory cells from the source-side selection gate transistor SGS, thereby charging the bit line BL. Then, the sense amplifier circuit 105 detects the potential of the bit line BL, and it is determined whether data is completely erased from the memory string on the basis of the level of the potential.

As such, it is possible to improve the charge performance of the voltage applied from the common source line CELSRC to the bit line BL through the memory cell groups during each erase verification operation (1st, 2nd, and 3rd shown in FIG. 11) by dividing a plurality of memory cells in the memory string into three memory cell groups, that is, a memory cell group close to the drain-side selection gate transistor SGD, an intermediate memory cell group, and a memory cell group close to the source-side selection gate transistor SGS, and performing three different erase verification operations on each of the memory cell groups to control the voltage level of the erase verification voltage. As a result, it is possible to improve the accuracy of the erase verification operation.

In FIG. 11, as shown in the field 'reduction in influence of potential difference on adjacent word lines', when an erase verification voltage of 0 V is applied to the memory cells M21 (1st) M20 (2nd), M42 (2nd), and M41 (3rd) adjacent to the division boundary during the first erase verification operation (1st), the second erase verification operation (2nd), and the third erase verification operation (3rd), it is possible to reduce the influence of the potential difference between the erase verification voltages of the memory cells and prevent a reduction in the accuracy of the erase verification operation. In this embodiment, the erase verification operation is performed on the SGS-side cells, the intermediate cells, and the SGD-side cells in this order. However, the erase verification operation may be performed on the memory cells in the reverse order. In this case, the same effects as described above are also obtained.

Third Embodiment

In the first embodiment, a plurality of memory cells in the memory string are divided into two memory cell groups, that is, the memory cell group close to the drain-side selection gate transistor SGD and the memory cell group close to the source-side selection gate transistor SGS, and two different erase verification operations are performed on each of the two memory cell groups. In this case, the first erase verification operation in which an erase verification voltage of 0 V is applied to the memory cell group including the memory cells M0 to M31 close to the source-side selection gate transistor SGS and the second erase verification operation in which an erase verification voltage of 0 V is applied to the memory cell group including the memory cells M32 to M63 close to the drain-side selection gate transistor SGD have different charge performances for the bit line BL.

Further, in the first embodiment, during the erase verification operation performed on the memory string including the dummy cells MS and MD shown in FIG. 8, an erase verification voltage of 0 V is applied to a plurality of memory cells M31 and M32 adjacent to the division boundary, which is different from the state of the voltage applied during a general read operation (a voltage Vread is applied to all the word lines WL other than a read target memory cell).

In a third embodiment, an example of an erase verification operation that improves the state of the voltage applied to a plurality of memory cells adjacent to the division boundary and the charge performance according to the first embodiment will be described. In addition, the overall structure of a NAND flash memory according to the third embodiment is the same as that of the NAND flash memory 100 shown in FIG. 1, and an illustration and description thereof will be omitted.

Next, the process of the main control circuit 106 in the NAND flash memory 100 during an erase verification operation will be described with reference to a flowchart shown in FIG. 12, an equivalent circuit of the memory string shown in FIG. 13, an example of the erase verification voltage applied to each memory cell group shown in FIG. 14, and a timing chart shown in FIG. 15. In the memory string shown in FIG. 13, 64 memory cells are connected in series to each other. The 64 memory cells are divided into two memory cell groups, that is, a memory cell group including odd-numbered memory cells M0, M2, . . . , M62 and a memory cell group including even-numbered memory cells M1, . . . , M61, and M63 that are arranged from the source-side selection gate transistor SGS according to the connection positions of the word lines WL. In the third embodiment, two different erase verification operations are performed on each of the memory cell group including the odd-numbered memory cells and the memory cell group including the even-numbered memory cell.

Figure 12:
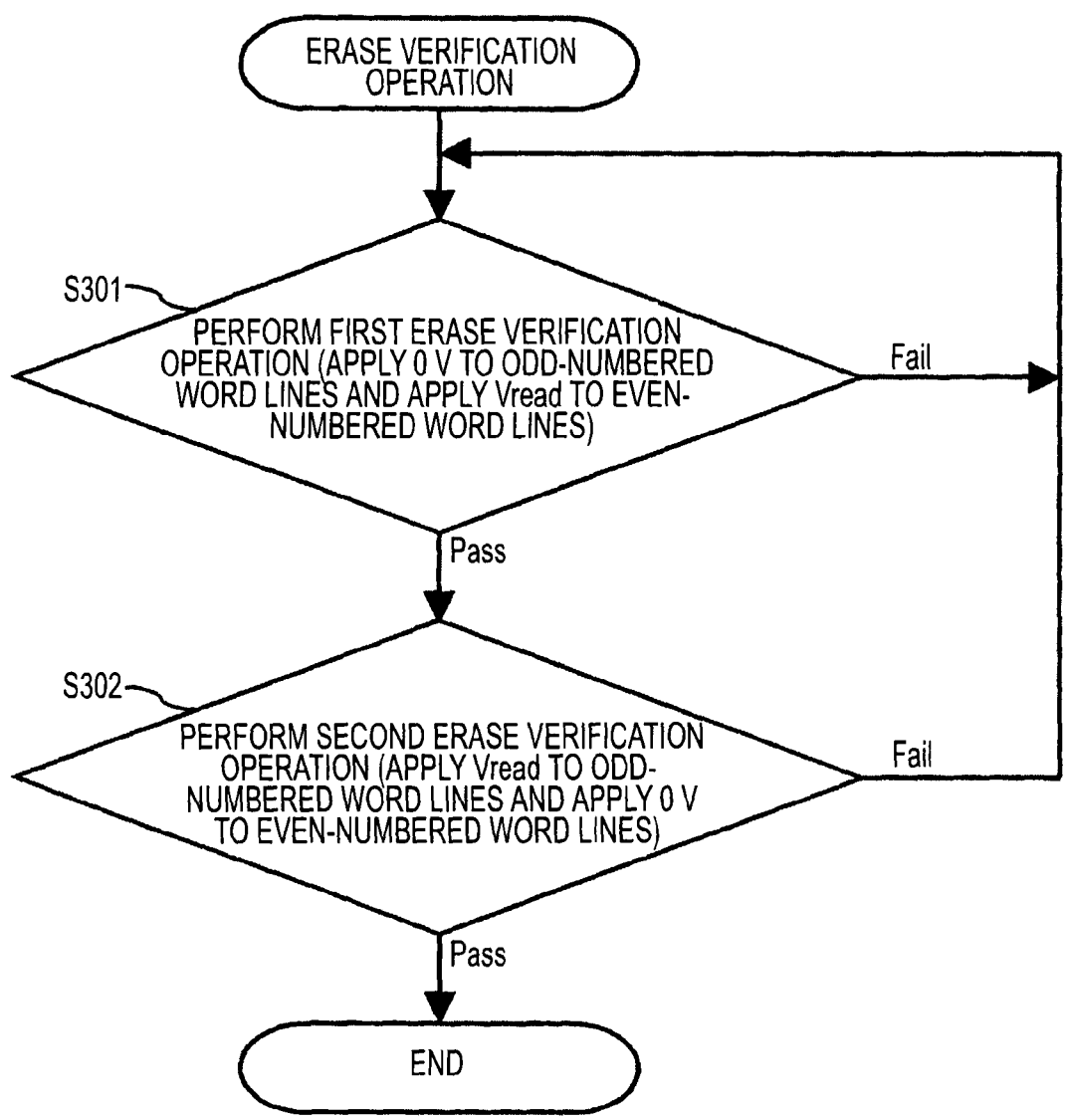
FIG. 12 is a flowchart illustrating the process of a main control circuit during an erase verification operation according to a third embodiment of the invention.
Figure 13A:
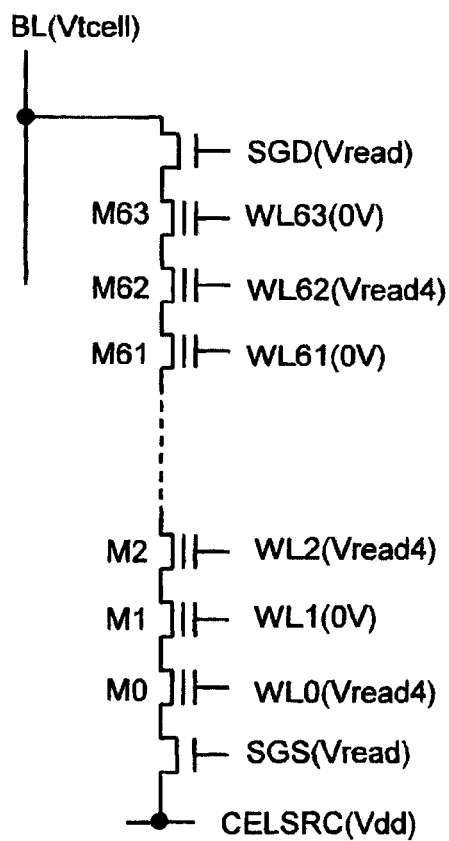
FIG. 13A is an equivalent circuit diagram illustrating the state of a voltage applied during a first erase verification operation according to the third embodiment.
Figure 15:
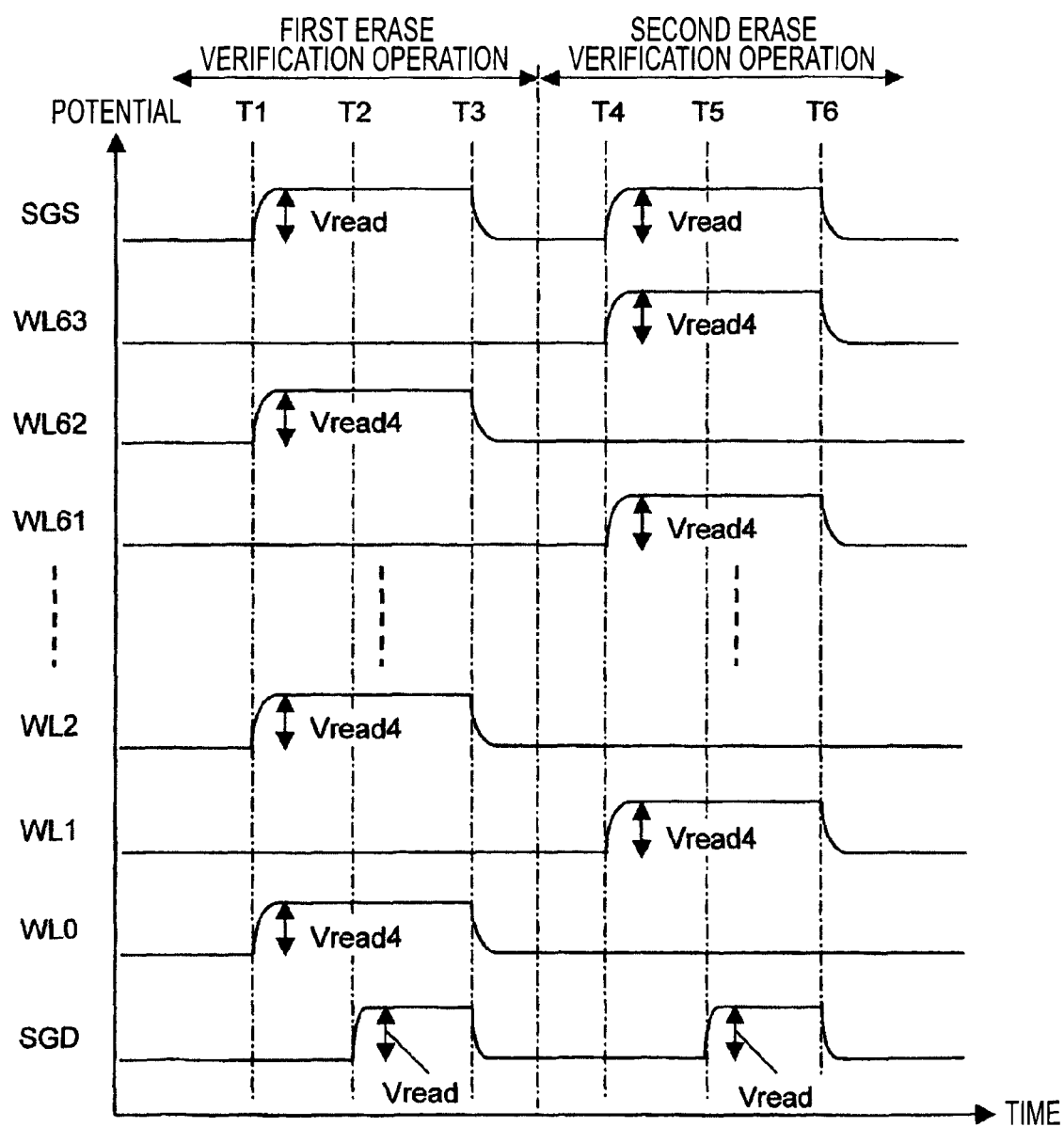
FIG. 15 is a timing chart illustrating the erase verification voltages applied to the memory cell groups during the erase verification operation according to the third embodiment.

In FIG. 12, the main control circuit 106 performs a first erase verification operation (Step S301, and T1 to T3 in FIG. 15). In this case, first, the main control circuit 106 applies a voltage Vdd to the common source line CELSRC. In addition, the main control circuit 106 applies a voltage of 0 V to the selected bit line BL to be in a floating state. Then, as shown in FIG. 13A and a field '1st' in a table of FIG. 14, the main control circuit 106 applies an erase verification voltage Vread4 to the word lines WL0, WL2, ..., WL(2k), ..., WL62 of the memory cell group including the odd-numbered memory cells M0, M2, ..., M(2k), ..., M62, and applies an erase verification voltage of 0 V to the word lines WL1, ..., WL(2k+1), ..., WL61, and WL63 of the memory cell group including the even-numbered memory cells M1, ..., M(2k+1), ..., M61, and M63 (where k=0, 1, ..., 31), thereby charging the bit line BL. Then, the sense amplifier circuit 105 detects the potential of the bit line BL, and it is determined whether data is completely erased from the memory string on the basis of the level of the potential.

Figure 13B:
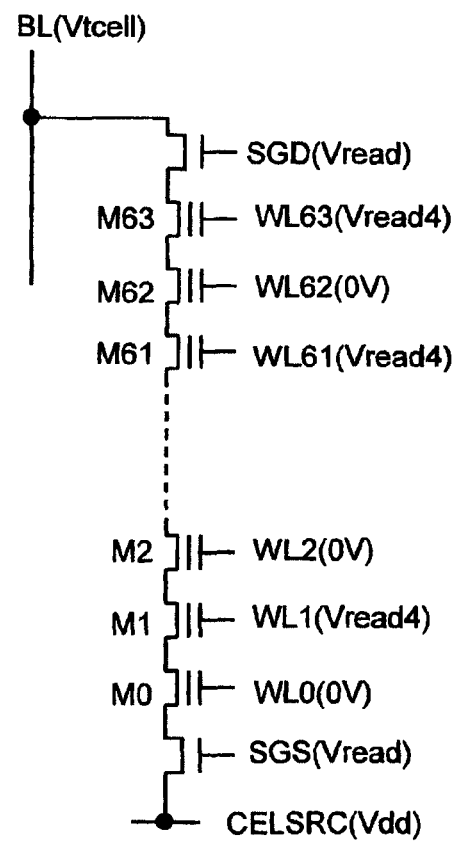
FIG. 13B is an equivalent circuit diagram illustrating the state of a voltage applied during a second erase verification operation according to the third embodiment.

Then, the main control circuit 106 performs a second erase verification operation (Step S302, and T4 to T6 in FIG. 15). In this case, first, the main control circuit 106 applies the voltage Vdd to the common source line CELSRC. In addition, the main control circuit 106 applies a voltage of 0 V to the selected bit line BL to be in a floating state. Then, as shown in FIG. 13B and a field '2nd' in the table of FIG. 14, the main control circuit 106 applies an erase verification voltage of 0 V to the word lines WL0, WL2, ..., WL(2k), ..., WL62 of the memory cell group including the odd-numbered memory cells M0, M2, ..., M(2k), ..., M62, and applies the erase verification voltage Vread4 to the word lines WL1, ..., WL(2k+1), ..., WL61, and WL63 of the memory cell group including the even-numbered memory cells M1, ..., M(2k+1), ..., M61, and M63 (where k=0, 1, ..., 31), thereby charging the bit line BL. Then, the sense amplifier circuit 105 detects the potential of the bit line BL, and it is determined whether data is completely erased from the memory string on the basis of the level of the potential. As for the voltage Vread4, it is preferable that Vread<Vread4 in order to reduce the influence of adjacent word lines WL.

Figure 33A:
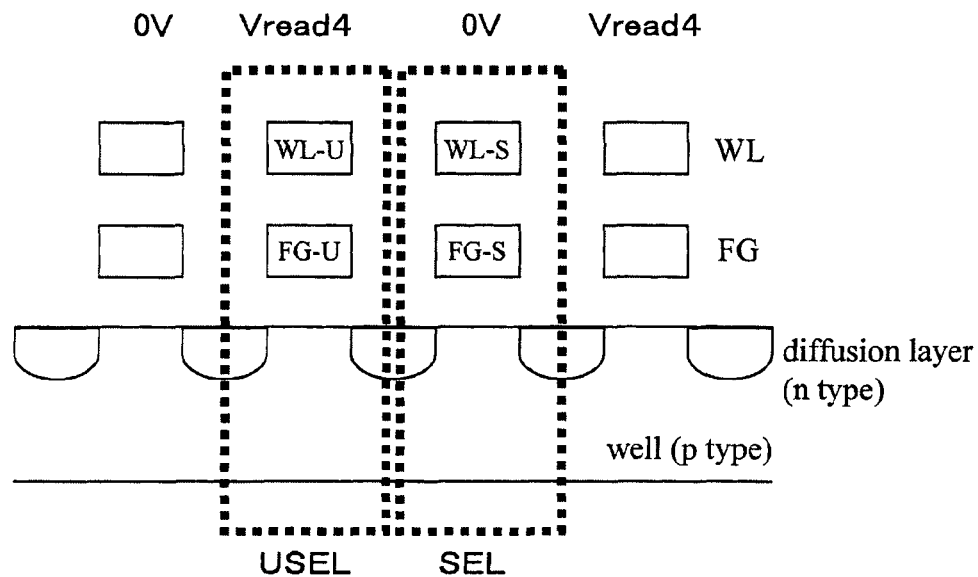
FIG. 33A is a cross-sectional diagram showing an example of the memory cell.

For example, the cell diffusion layer is an n type, and the cell well is a p type. The charge storage layer of the cell has a floating gate FG. FIG. 33A shows cross-sectional view of the cell diffusion layer, the cell well, and the charge storage layer.

In the third embodiment, in the cell SEL that performs erase verification, a voltage applied to the word line WL-S, that is, a voltage applied to the gate of the cell is low (0 V). On the other hand, in the cell USEL that does not perform erase verification, the voltage applied to the word line WL-U is high (Vread4). In this case, as the gate voltage Vread4 of the cell USEL is increased, a cell current from the source line to the bit line is increased. Therefore, it is possible to improve the accuracy of erase verification and shorten the operation time of erase verification. However, when a cell-to-cell interference effect (the influence of capacitive coupling between the floating gates FG or the word lines WL) becomes remarkable as the size of a cell is reduced, the following phenomena occur.

<1> Interference of FG Potential in Erase Verification Operation

Figure 33B:
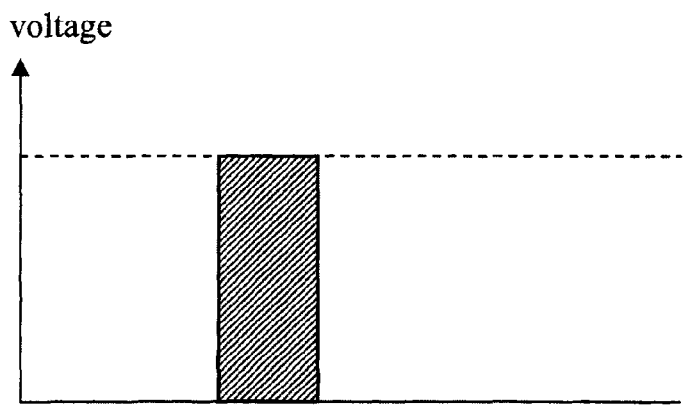
FIGS. 33B and 33C are graphs showing variations of potential of adjacent floating gates.
Figure 33C:
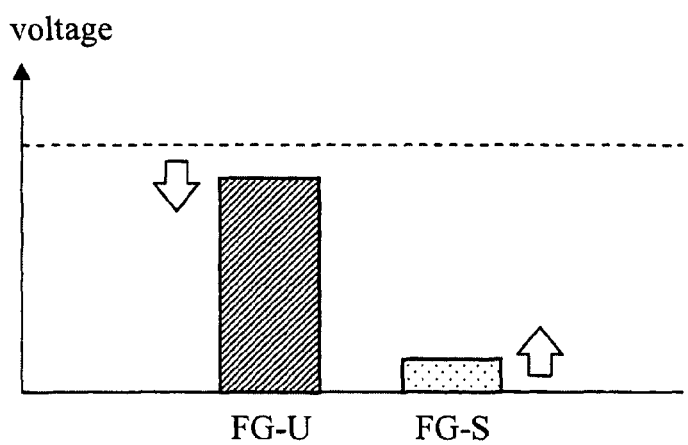

When the potential of an adjacent word line WL-U or an adjacent floating gate FG-U is increased, the potential of the floating gate FG-S is higher than that when a voltage of 0 V is applied to the gate and there is no interference of the potential of the floating gate FG (FIG. 33B), as shown in FIG. 33C. This variation serves as noise that causes the cell that cannot be erased to be determined to be completely erased.

When the potential of an adjacent word line WL-S or an adjacent floating gate FG-S is reduced, the potential of the floating gate FG-U is lower than that when the voltage Vread4 is applied to the gate and there is no interference of the potential of the floating gate FG (FIG. 33B), as shown in FIG. 33C. This variation serves as noise that makes it difficult for the cell USEL to be turned on even when the voltage Vread4 is applied.

<2> Variation in FG Potential when Write Operation is Performed after Erase Operation When no data is written to the erased cell (hereinafter, referred to as a cell of interest) after data is erased from the cell and data is written to adjacent cells, the FG potential of an adjacent cell is reduced, and the FG potential of the cell of interest is reduced due to the capacitive coupling between FG of the adjacent cell and FG of the cell of interest. In addition, the voltage Vth of the cell of interest is increased. This serves as noise that causes data to be written to the cell of interest. As the size of a cell is reduced, a variation in the FG potential of the cell of interest is increased. Therefore, it is necessary to increase a Vth target of the cell having data written thereto or lower the upper limit of the Vth distribution of the erase cell (lower the voltage Vth and erase data).

In the case of <1>, it is possible to select whether to give priority to turn on the cell USEL or to improve the accuracy of the erase verification of the cell SEL. When priority is given to turn on the cell USEL, the voltage Vread4 is set to be higher than the voltage Vread of the selection gate. When priority is given to improve the accuracy of the erase verification of the cell SEL, the voltage Vread4 is set to be lower than the voltage Vread of the selection gate.

In the case of <2>, it is possible to select one of the Vth distribution of data in an erased state and the Vth distribution of data in a written state as a target. When the Vth distribution target of data in the written state is increased, the voltage Vread4 is set to be higher than the voltage Vread of the selection gate. When the Vth distribution target of data in the erased state is decreased, the voltage Vread4 is set to be lower than the voltage Vread of the selection gate. When the Vth distribution target of data in the written state is increased, stress applied to the gate insulating film between the word line WL and the charge storage layer of the cell in a written state is increased, and the voltage (Vread) of a non-selected word line WL tends to be increased during a read operation. Therefore, it is necessary to increase the voltage Vread4. On the other hand, when the Vth distribution target of data in the erased state is decreased, stress applied to the gate insulating film between the substrate and the charge storage layer is increased. In addition, when a read operation is repeated, strong stress is applied to the gate insulating film between the substrate and the charge storage layer in the cell in the erased state.

The above-mentioned relationship is shown in FIG. 34. Therefore, when priority is given to the on-characteristics of the cell USEL and the operation time of erase verification, it is preferable that the voltages be set to satisfy Vread<Vread4. This is effective when the cell current is reduced with a reduction in the size of a cell.

In the Vth distribution of the cell, when the voltage Vth is high and there is a large cell-to-cell interference, it is preferable that the voltages be set to satisfy Vread4<Vread. This is effective since the cell-to-cell interference is increased with a reduction in the size of a cell.

It is preferable that the magnitude relationship between the voltages Vread4 and Vread be established depending on the above-mentioned effects. For the cell-to-cell interference, when a WL space or a BL space is less than 40 nm, the latter (Vread4<Vread) is likely to be more effective, that strongly depends on cell structure.

In addition, it is necessary to ensure a data retention margin of a charge trap memory cell in which the charge storage layer is an insulating film, not the floating gate. In general, the latter (Vread4<Vread) can be more effective.

As such, it is possible to improve the charge performance of the voltage applied from the common source line CELSRC to the bit line BL through the memory cell groups during each erase verification operation (1st and 2nd shown in FIG. 14) by dividing a plurality of memory cells in the memory string into two memory cell groups, that is, a memory cell group including the odd-number memory cells and a memory cell group including the even-number memory cells and performing two different erase verification operations on each of the memory cell groups to control the voltage level of the erase verification voltage. As a result, it is possible to further improve the accuracy of the erase verification operation.

That is, in the erase verification operation according to the third embodiment, a voltage of 0 V is alternately applied to the even-numbered memory cells and the odd-numbered memory cells. Therefore, the charge performances with respect to the bit line BL in the first and second erase verification operations are substantially equal to each other. As a result, it is possible to further improve the accuracy of the erase verification operation.

Next, a case in which a memory string including dummy cells MS and MD is divided into two memory cell groups, that is, a memory cell group including odd-numbered memory cells and a memory cell group including even-numbered memory cells and two different erase verification operations are performed on each of the memory cell groups will be described with reference to an equivalent circuit of the memory string shown in FIG. 16 and an example of the erase verification voltage applied to each memory cell group shown in FIG. 17. In the memory string shown in FIG. 16, 64 memory cells are connected in series to each other.

Figure 16A:
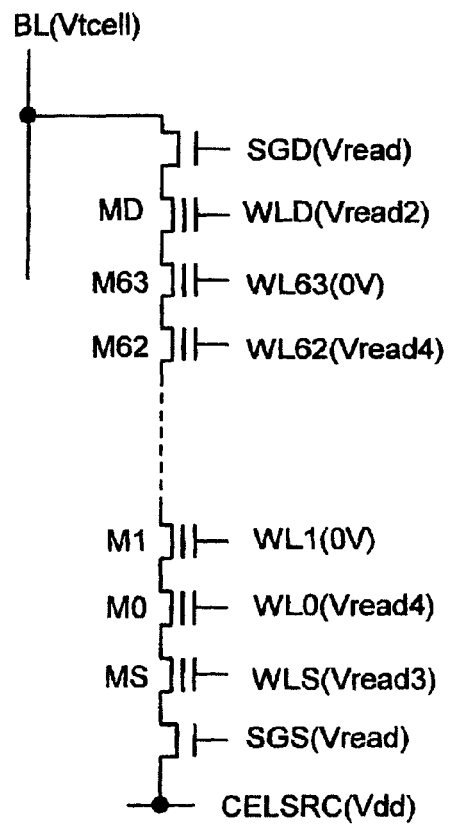
FIG. 16A is an equivalent circuit diagram illustrating the state of the voltage applied during the first erase verification operation according to the third embodiment.

In FIG. 16A, the main control circuit 106 performs a first erase verification operation. In this case, first, the main control circuit 106 applies the voltage Vdd to the common source line CELSRC to be charged. In addition, the main control circuit 106 applies a voltage of 0 V to the selected bit line BL to be in a floating state. Then, as shown in a field '1st' in a table of FIG. 17, the main control circuit 106 respectively applies the erase verification voltages Vread2 and Vread3 to the word lines WLD and WLS of the dummy cells MD and MS, applies the erase verification voltage Vread4 to the word lines WL0, WL2, ..., WL(2k), ..., WL62 of the memory cell group including the odd-numbered memory cells M0, M2, ..., M(2k), ..., M62, and applies an erase verification voltage of 0 V to the word lines WL1, ..., WL(2k+1), ..., WL61, and WL63 of the memory cell group including the even-numbered memory cells M1, ..., M(2k+1), ..., M61, and M63 (where k=0, 1, ..., 31), thereby charging the bit line BL. Then, the sense amplifier circuit 105 detects the potential of the bit line BL, and it is determined whether data is completely erased from the memory string on the basis of the level of the potential.

Figure 16B:
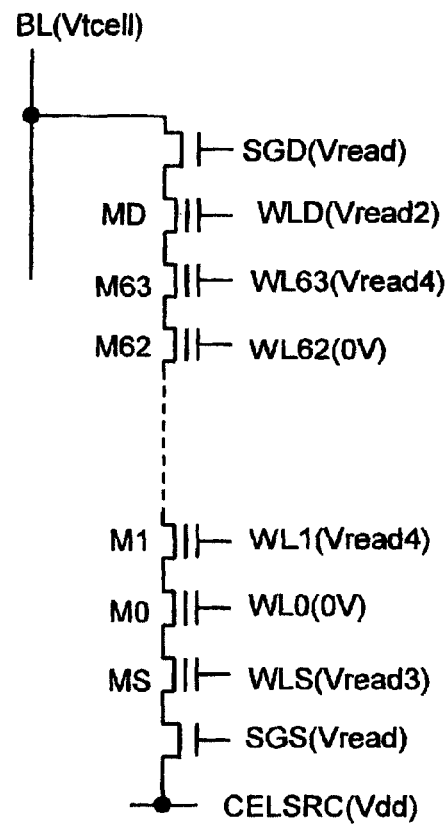
FIG. 16B is an equivalent circuit diagram illustrating the state of the voltage applied during the second erase verification operation according to the third embodiment.

In FIG. 16B, the main control circuit 106 performs a second erase verification operation. In this case, first, the main control circuit 106 applies the voltage Vdd to the common source line CELSRC. In addition, the main control circuit 106 applies a voltage of 0 V to the selected bit line BL to be in a floating state. Then, as shown in a field '2nd' in the table of FIG. 17, the main control circuit 106 respectively applies the erase verification voltages Vread2 and Vread3 to the word lines WLD and WLS of the dummy cells MD and MS, applies an erase verification voltage of 0 V to the word lines WL0, WL2, ..., WL(2k), ..., WL62 of the memory cell group including the odd-numbered memory cells M0, M2, ..., M(2k), M62, and applies the erase verification voltage Vread4 to the word lines WL1, ..., WL(2k+1), ..., WL61, and WL63 of the memory cell group including the even-numbered memory cells M1, ..., M(2k+1), ..., M61, and M63 (where k=0, 1, ..., 31), thereby charging the bit line BL. Then, the sense amplifier circuit 105 detects the potential of the bit line BL, and it is determined whether data is completely erased from the memory string on the basis of the level of the potential. Similar to FIG. 4B, in general, it is preferable that the voltages satisfy Vread3≦Vread2≦Vread.

As such, the erase verification voltage application conditions written in the table shown in FIG. 16 are applied to the memory string including the dummy cells MS and MD shown in FIG. 16, and the memory string is divided into two memory cell groups, that is, the memory cell group including the odd-numbered memory cells and the memory cell group including the even-numbered memory cells. In addition, two different erase verification operations are performed on each of the memory cell groups to control the voltage level of the erase verification voltage. In this way, it is possible to improve the charge performance of the voltage applied from the common source line CELSRC to the bit line BL through the memory cell groups during each erase verification operation (1st and 2nd shown in FIG. 16). As a result, it is possible to further improve the accuracy of the erase verification operation performed on the memory string including the dummy cells. In addition, the order of the erase verification operation performed on the memory cell group including the odd-numbered memory cells and the memory cell group including the even-numbered memory cells may be reverse to that in this embodiment. In this case, the same effects as described above are also obtained.

Fourth Embodiment

In the third embodiment, a plurality of memory cells in the memory string are divided into two memory cell groups, that is, a memory cell group including the odd-numbered memory cells and a memory cell group including the even-numbered memory cells, and two different erase verification operations are performed on each of the memory cell groups. In a fourth embodiment, a case in which a plurality of memory cells in a memory string are divided into three memory cell groups according to the connection positions of the word lines WL such that an erase verification voltage of 0 V is applied to every two memory cells and three different erase verification operations are performed on each of the memory cell groups will be described. The overall structure of a NAND flash memory according to the fourth embodiment is the same as that of the NAND flash memory 100 shown in FIG. 1, and an illustration and description thereof will be omitted.

Next, the process of the main control circuit 106 in the NAND flash memory 100 during an erase verification operation will be described with reference to a flowchart shown in FIG. 18, an equivalent circuit of the memory string shown in FIG. 19, an example of the erase verification voltage applied to each memory cell group shown in FIG. 20, and a timing chart shown in FIG. 21. In the memory string shown in FIG. 19, 64 memory cells are connected in series to each other.

Figure 18:
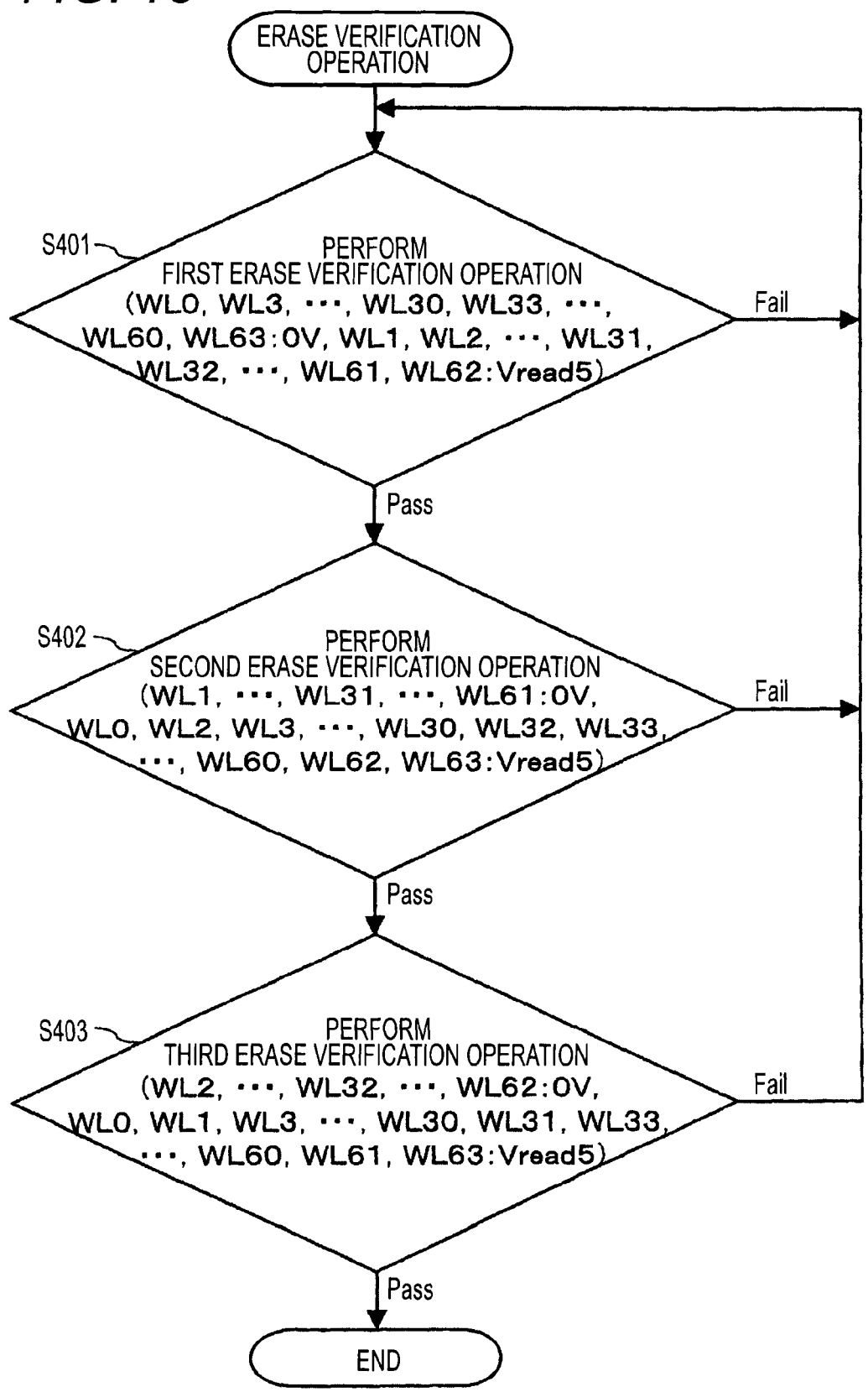
FIG. 18 is a flowchart illustrating the process of a main control circuit during an erase verification operation according to a fourth embodiment of the invention.
Figure 19:
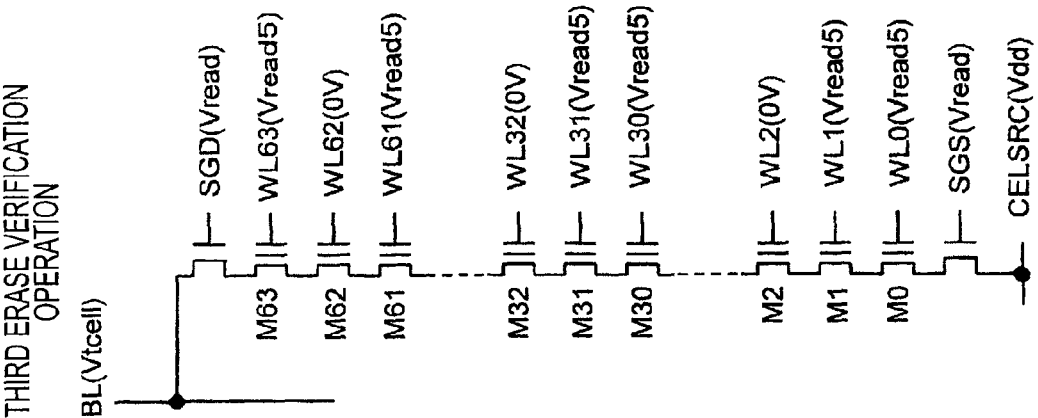
FIG. 19A is an equivalent circuit diagram illustrating the state of a voltage applied during a first erase verification operation according to the fourth embodiment.
FIG. 19B is an equivalent circuit diagram illustrating the state of a voltage applied during a second erase verification operation according to the fourth embodiment.
FIG. 19C is an equivalent circuit diagram illustrating the state of a voltage applied during a third erase verification operation according to the fourth embodiment.

In FIG. 18, the main control circuit 106 performs a first erase verification operation (Step S401 and T1 to T3 shown in FIG. 21). In this case, first, the main control circuit 106 applies a voltage Vdd to the common source line CELSRC. In addition, the main control circuit 106 applies a voltage of 0 V to the selected bit line BL to be in a floating state. Then, as shown in FIG. 19A and a field '1st' in a table of FIG. 20, the main control circuit 106 applies an erase verification voltage of 0 V to word lines WL(3k) and WL63, that is, word lines WL0, WL3, ..., WL30, WL33, ..., WL60, and WL63, of a memory cell group including memory cells M(3$k$) and a memory cell M63, that is, memory cells M0, M3, ..., M30, M33, ..., M60, and M63, and applies an erase verification voltage Vread5 to word lines WL1, WL2, ..., WL31, WL32, ..., WL61, and WL62 of memory cell groups including memory cells M(3$k$+1) and M(3$k$+2) (where k=0, 1, ..., 20), that is, memory cells M1, M2, ..., M31, M32, ..., M61, and M62, thereby charging the bit line BL. Then, the sense amplifier circuit 105 detects the potential of the bit line BL, and it is determined whether data is completely erased from the memory string on the basis of the level of the potential.

Then, the main control circuit 106 performs a second erase verification operation (Step S402 and T4 to T6 shown in FIG. 21). In this case, first, the main control circuit 106 applies the voltage Vdd to the common source line CELSRC. In addition, the main control circuit 106 applies a voltage of 0 V to the selected bit line BL to be in a floating state. Then, as shown in FIG. 19B and a field '2nd' in the table of FIG. 20, the main control circuit 106 applies an erase verification voltage of 0 V to the word lines WL(3$k$+1), that is, the word lines WL1, ..., WL31, ..., WL61, of the memory cell group including the memory cells M(3$k$+1), that is, the memory cells M1, ..., M31, ..., M61, and applies the erase verification voltage Vread5 to the word lines WL(3$k$), WL63, and WL(3$k$+2), that is, the word lines WL0, WL2, WL3, ..., WL30, WL32, WL33, ..., WL60, WL62, and WL63, of the memory cell groups including the memory cells M(3$k$), the memory cell M63, and the memory cells M(3$k$+2), that is, the memory cells M0, M2, M3, ..., M30, M32, M33, ..., M60, M62, and M63 (where k=0, 1, ..., 20), thereby charging the bit line BL. Then, the sense amplifier circuit 105 detects the potential of the bit line BL, and it is determined whether data is completely erased from the memory string on the basis of the level of the potential.

Then, the main control circuit 106 performs a third erase verification operation (Step S403 and T7 to T9 shown in FIG. 21). In this case, first, the main control circuit 106 applies the voltage Vdd to the common source line CELSRC. In addition, the main control circuit 106 applies a voltage of 0 V to the selected bit line BL to be in a floating state. Then, as shown in FIG. 19C and a field '3rd' in the table of FIG. 20, the main control circuit 106 applies an erase verification voltage of 0 V to the word lines WL(3$k$+2), that is, the word lines WL2, ..., WL32, ..., WL62, of the memory cell group including the memory cells M(3$k$+2), that is, the memory cells M2, ..., M32, ..., M62, and applies the erase verification voltage Vread5 to the word lines WL(3$k$), WL63, and WL(3$k$+1), that is, the word lines WL0, WL1, WL3, ..., WL30, WL31, WL33, ..., WL60, WL61, and WL63, of the memory cell groups including the memory cells M(3$k$), the memory cell M63, and the memory cells M(3$k$+1) (where k=0, 1, ..., 20), that is, the memory cells M0, M1, M3, ..., M30, M31, M33, ..., M60, M61, and M63, thereby charging the bit line BL. Then, the sense amplifier circuit 105 detects the potential of the bit line BL, and it is determined whether data is completely erased from the memory string on the basis of the level of the potential. As for the voltage Vread5, it is preferable that Vread<Vread5 in order to reduce the influence of adjacent word lines WL.

As mentioned in the third embodiment, Vread5<Vread may be preferable in order to reduce the influence of adjacent word lines WL.

As such, it is possible to improve the charge performance of the voltage applied from the common source line CELSRC to the bit line BL through the memory cell groups during each erase verification operation (1st, 2nd, and 3rd shown in FIG. 20) by dividing a plurality of memory cells in the memory string into three memory cell groups such that an erase verification voltage of 0 V is applied to every two memory cells, and performing three different erase verification operations on each of the memory cell groups to control the voltage level of the erase verification voltage. As a result, it is possible to further improve the accuracy of the erase verification operation.

Next, a case in which a plurality of memory cells in a memory string including dummy cells MS and MD are divided into three memory cell groups such that an erase verification voltage of 0 V is applied to every two memory cells and three different erase verification operations are performed on each of the memory cell groups will be described with reference to an equivalent circuit of the memory string shown in FIG. 22 and an example of the erase verification voltage applied to each memory cell group shown in FIG. 23. In the memory string shown in FIG. 22, 64 memory cells are connected in series to each other.

Figures 22A, 22B, 22C:
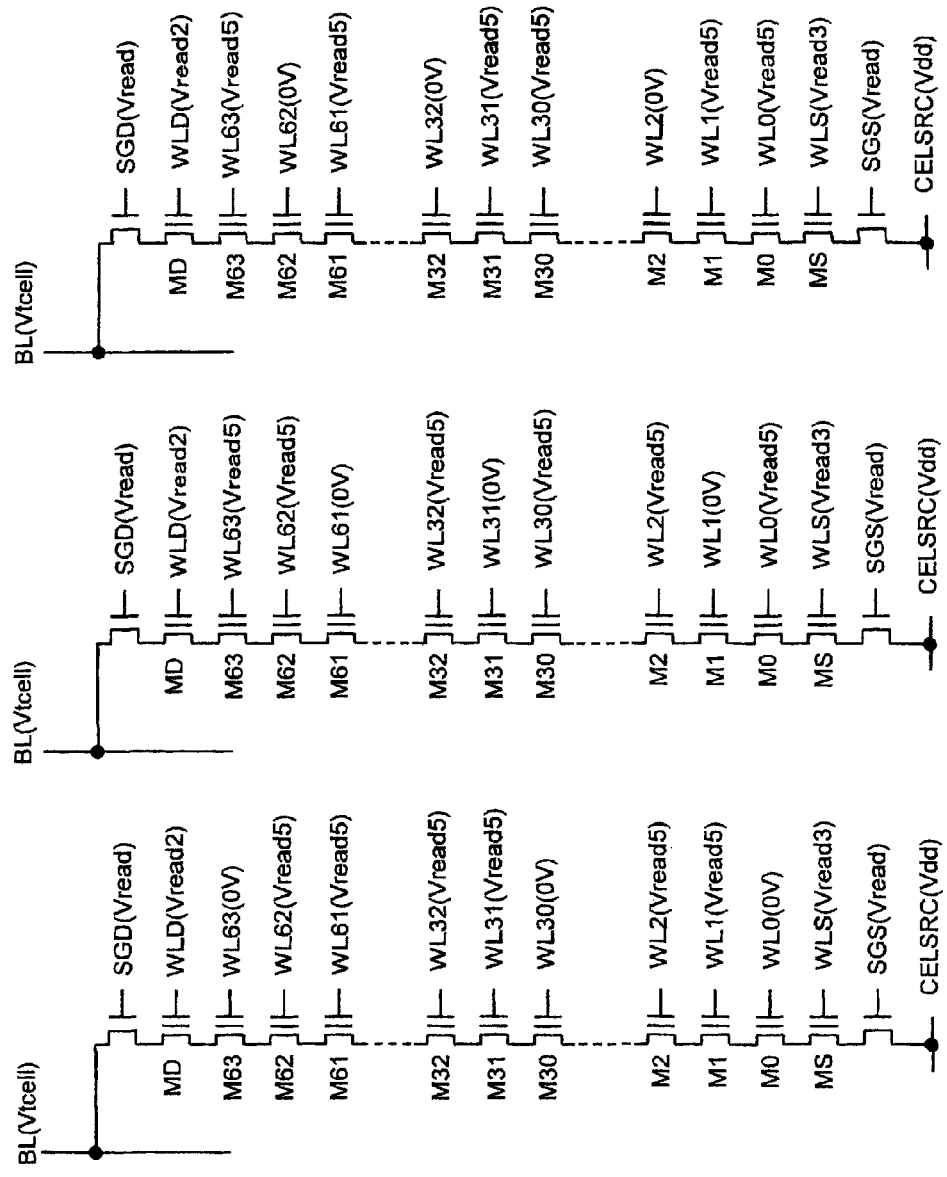
FIG. 22A is an equivalent circuit diagram illustrating the state of the voltage applied during the first erase verification operation according to the fourth embodiment.
FIG. 22B is an equivalent circuit diagram illustrating the state of the voltage applied during the second erase verification operation according to the fourth embodiment.
FIG. 22C is an equivalent circuit diagram illustrating the state of the voltage applied during the third erase verification operation according to the fourth embodiment.

In FIG. 22A, the main control circuit 106 performs the first erase verification. In this case, first, the main control circuit 106 applies the voltage Vdd to the common source line CELSRC. In addition, the main control circuit 106 applies a voltage of 0 V to the selected bit line BL to be in a floating state. Then, as shown in a field '1st' in a table of FIG. 23, the main control circuit 106 respectively applies the erase verification voltages Vread2 and Vread3 to the word lines WLD and WLS of the dummy cells MD and MS, applies an erase verification voltage of 0 V to the word lines WL(3$k$) and WL63, that is, the word lines WL0, WL3, ..., WL30, WL33, ..., WL60, and WL63, of the memory cell group including the memory cells M(3$k$) and the memory cell M63, that is, the memory cells M0, M3, ..., M30, M33, ..., M60, and M63, and applies the erase verification voltage Vread5 to the word lines WL(3$k$+1) and WL(3$k$+2), that is, the word lines WL1, WL2, ..., WL31, WL32, ..., WL61, and WL62, of the memory cell groups including the memory cells M(3$k$+1) and M(3$k$+2) (where k=0, 1, ..., 20), that is, the memory cells M1, M2, ..., M31, M32, ..., M61, and M62, thereby charging the bit line BL. Then, the sense amplifier circuit 105 detects the potential of the bit line BL, and it is determined whether data is completely erased from the memory string on the basis of the level of the potential.

Then, in FIG. 22B, the main control circuit 106 performs the second erase verification. In this case, first, the main control circuit 106 applies the voltage Vdd to the common source line CELSRC. In addition, the main control circuit 106 applies a voltage of 0 V to the selected bit line BL to be in a floating state. Then, as shown in a field '2nd' in the table of FIG. 23, the main control circuit 106 respectively applies the erase verification voltages Vread2 and Vread3 to the word lines WLD and WLS of the dummy cells MD and MS, applies an erase verification voltage of 0 V to the word lines WL(3$k$+1), that is, the word lines WL1, ..., WL31, ..., WL61, of the memory cell group including the memory cells M(3$k$+1), that is, the memory cells M1, ..., M31, ..., M61, and applies the erase verification voltage Vread5 to the word lines WL(3$k$), WL63, and WL(3$k$+2), that is, the word lines WL0, WL2, WL3, ..., WL30, WL32, WL33, ..., WL60, WL62, and WL63, of the memory cell groups including the memory cells M(3$k$), the memory cell M63, and the memory cells M(3$k$+2) (where k=0, 1, ..., 20), that is, the memory cells M0, M2, M3, ..., M30, M32, M33, ..., M60, M62, and M63, thereby charging the bit line BL. Then, the sense amplifier circuit 105 detects the potential of the bit line BL, and it is determined whether data is completely erased from the memory string on the basis of the level of the potential.

Then, in FIG. 22C, the main control circuit 106 performs the third erase verification. In this case, first, the main control circuit 106 applies the voltage Vdd to the common source line CELSRC. In addition, the main control circuit 106 applies a voltage of 0 V to the selected bit line BL to be in a floating state. Then, as shown in a field '3rd' in the table of FIG. 23, the main control circuit 106 respectively applies the erase verification voltages Vread2 and Vread3 to the word lines WLD and WLS of the dummy cells MD and MS, applies an erase verification voltage of 0 V to the word lines WL(3k+2), that is, the word lines WL2, . . . , WL32, . . . , WL62, of the memory cell group including the memory cells M(3k+2), that is, the memory cells M2, . . . , M32, . . . , M62, and applies the erase verification voltage Vread5 to the word lines WL(3k), WL63, and WL(3k+1), that is, the word lines WL0, WL1, WL3, . . . , WL30, WL31, WL33, . . . , WL60, WL61, and WL63, of the memory cell groups including the memory cells M(3k), the memory cell M63, and the memory cells M(3k+1) (where k=0, 1, . . . , 20), that is, the memory cells M0, M1, M3, . . . , M30, M31, M33, . . . , M60, M61, and M63, thereby charging the bit line BL. Then, the sense amplifier circuit 105 detects the potential of the bit line BL, and it is determined whether data is completely erased from the memory string on the basis of the level of the potential. Similar to FIG. 4B, in general, it is preferable that the voltages satisfy Vread3≦Vread2≦Vread.

As such, the erase verification voltage application conditions written in the table shown in FIG. 23 are applied to the memory string including the dummy cells MS and MD shown in FIG. 22, and a plurality of memory cells in the memory string are divided into three memory cell groups such that an erase verification voltage of 0 V is applied to every two memory cells. Then, three different erase verification operations are performed on each of the memory cell groups to control the voltage level of the erase verification voltage. In this way, it is possible to improve the charge performance of the voltage applied from the common source line CELSRC to the bit line BL through the memory cell groups during each erase verification operation (1st, 2nd, and 3rd shown in FIG. 23). As a result, it is possible to further improve the accuracy of the erase verification operation performed on the memory string including the dummy cells. In addition, the order of the erase verification operations may be different from that in this embodiment. In this case, the same effects as described above are also obtained.

Fifth Embodiment

In the fourth embodiment, a plurality of memory cells in a memory string are divided into three memory cell groups according to the connection positions of the word lines WL such that an erase verification voltage of 0 V is applied to every two memory cells, and three different erase verification operations are performed on each of the memory cell groups. In a fifth embodiment, a case in which a plurality of memory cells in a memory string are divided into four memory cell groups according to the connection positions of the word lines WL such that an erase verification voltage of 0 V is applied to every three memory cells and four different erase verification operations are performed on each of the memory cell groups. In addition, the overall structure of a NAND flash memory according to the fifth embodiment is the same as that of the NAND flash memory 100 shown in FIG. 1, and an illustration and description thereof will be omitted.

Next, the process of the main control circuit 106 in the NAND flash memory 100 during an erase verification operation will be described with reference to a flowchart shown in FIG. 24, an equivalent circuit of the memory string shown in FIGS. 25 and 26, an example of the erase verification voltage applied to each memory cell group shown in FIG. 27, and a timing chart shown in FIG. 28. In the memory string shown in FIG. 25, 64 memory cells are connected in series to each other.

Figure 24:
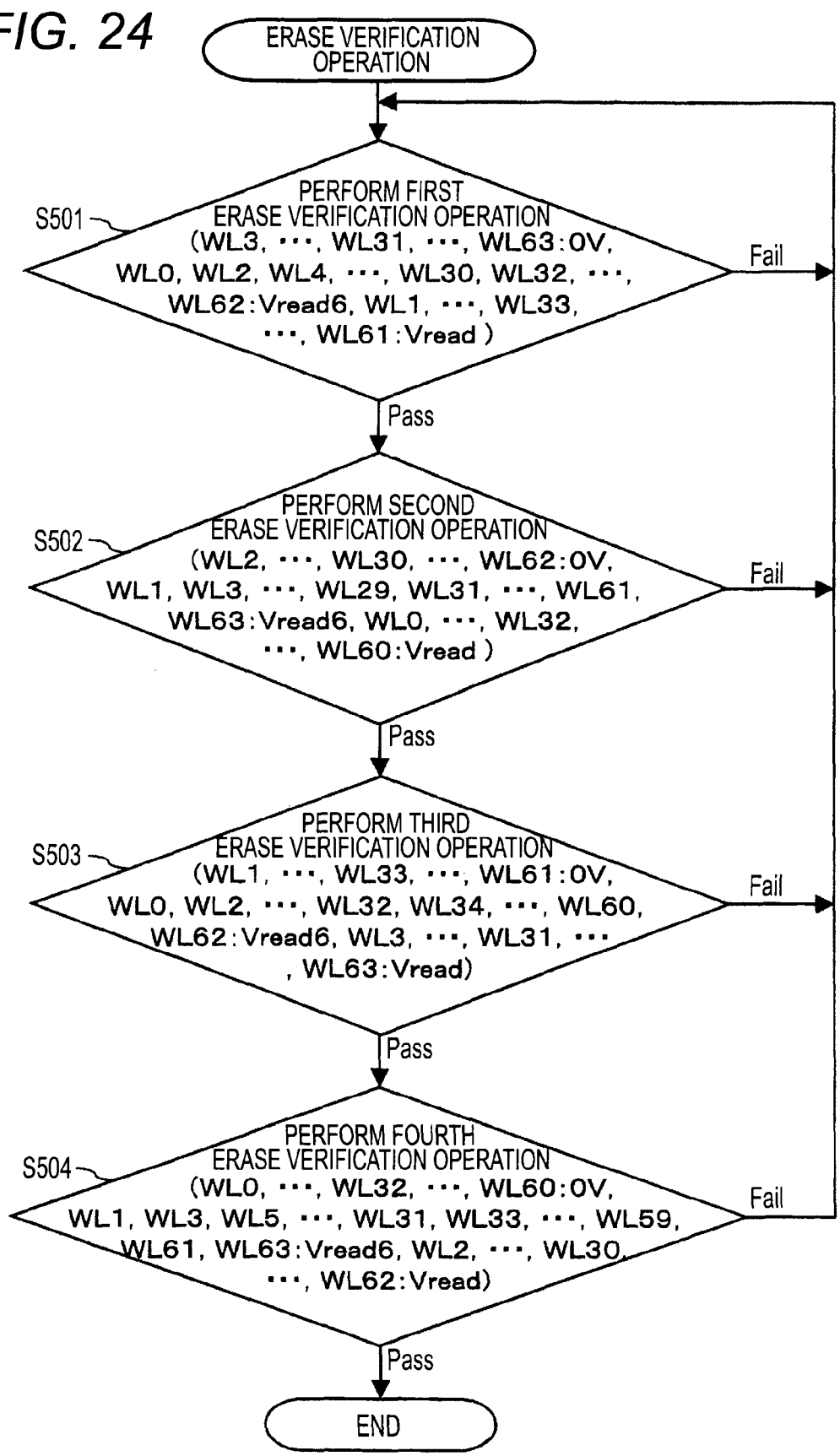
FIG. 24 is a flowchart illustrating the process of a main control circuit during an erase verification operation according to a fifth embodiment of the invention.
Figure 25A:
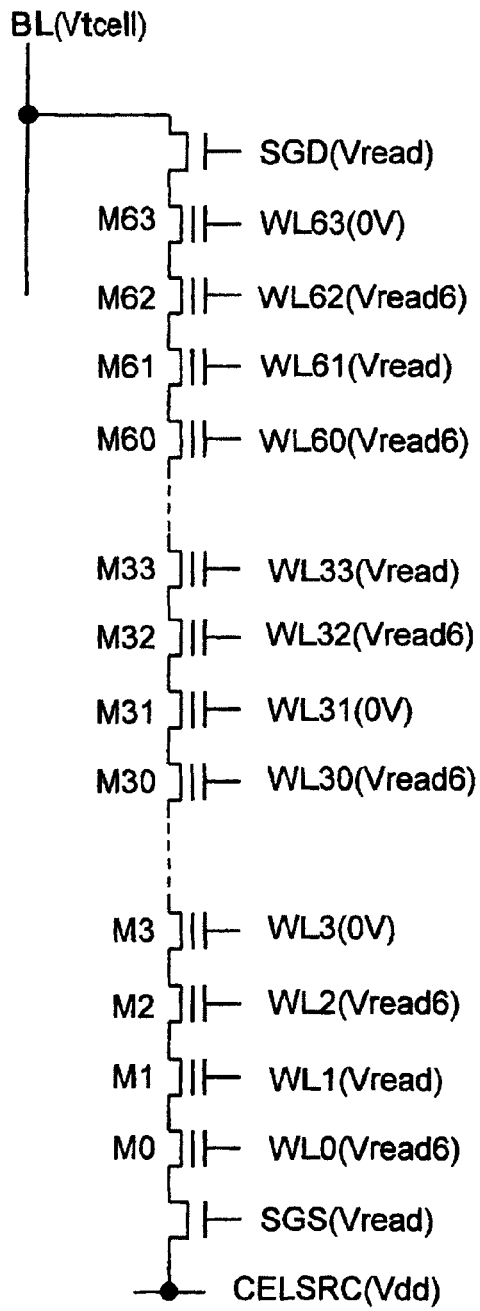
FIG. 25A is an equivalent circuit diagram illustrating the state of a voltage applied during a first erase verification operation according to the fifth embodiment.
Figure 28:
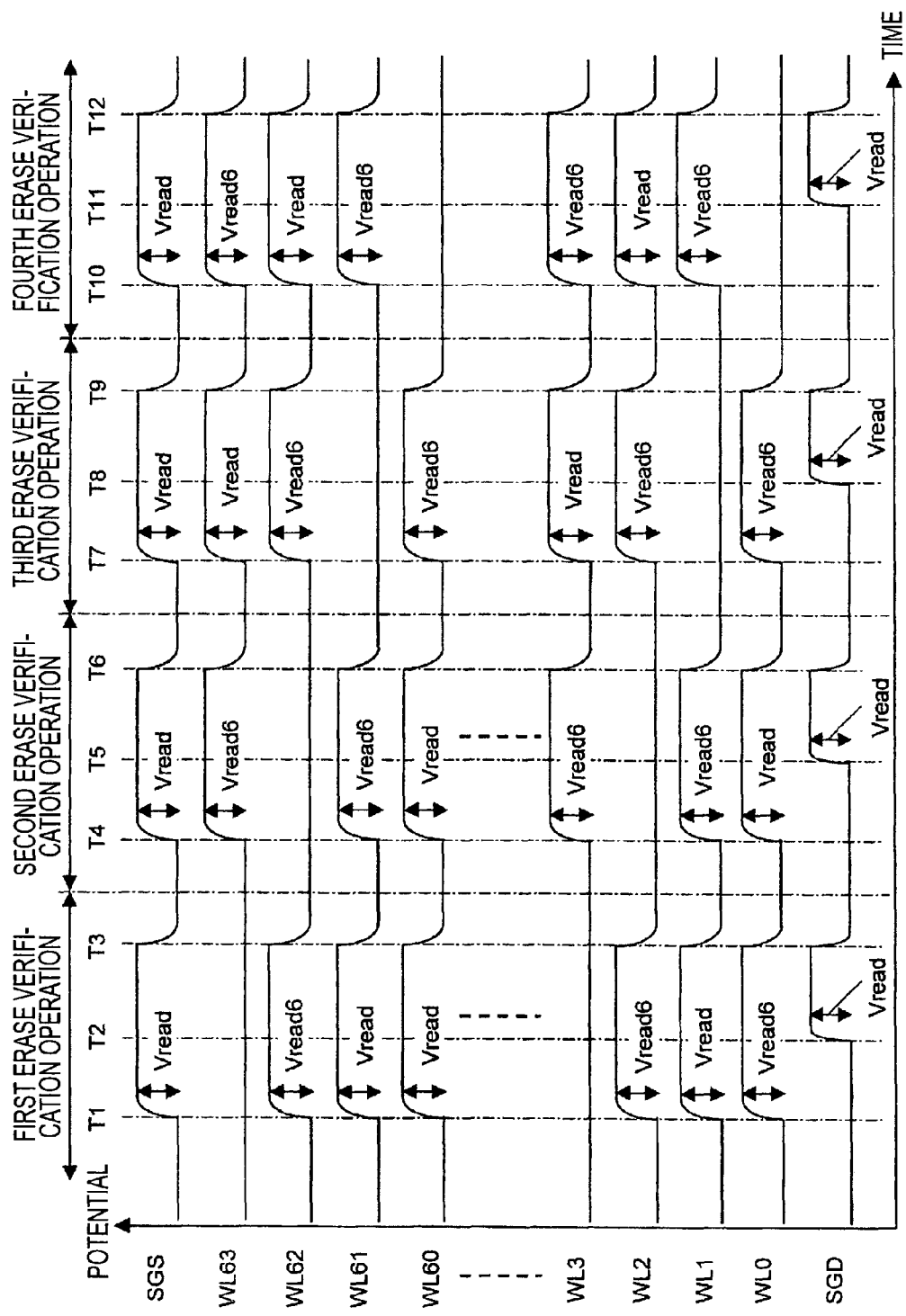
FIG. 28 is a timing chart illustrating the erase verification voltages applied to the memory cell groups during the erase verification operation according to the fifth embodiment.

In FIG. 24, the main control circuit 106 performs a first erase verification operation (Step S501 and T1 to T3 shown in FIG. 28). In this case, first, the main control circuit 106 applies a voltage Vdd to the common source line CELSRC. In addition, the main control circuit 106 applies a voltage of 0 V to the selected bit line BL to be in a floating state. Then, as shown in FIG. 25A and a field '1st' in a table of FIG. 27, the main control circuit 106 applies an erase verification voltage of 0 V to word lines WL3, . . . , WL31, . . . , WL63 of a memory cell group including memory cells M(4k+3), that is, memory cells M3, . . . , M31, . . . , M63, applies an erase verification voltage Vread6 to word lines WL(4k+2) and WL(4k), that is, word lines WL0, WL2, WL4, . . . , WL30, WL32, . . . , WL62, of memory cell groups including memory cells M(4k+2) and M(4k), that is, memory cells M0, M2, M4, . . . , M30, M32, . . . , M62, and applies an erase verification voltage Vread to word lines WL(4k+1), that is, word lines WL1, . . . , WL33, . . . , WL61, of a memory cell group including memory cells M(4k+1) (where k=0, 1, . . . , 15), that is, memory cells M1, . . . , M33, . . . , M61, thereby charging the bit line BL. Then, the sense amplifier circuit 105 detects the potential of the bit line BL, and it is determined whether data is completely erased from the memory string on the basis of the level of the potential.

Figure 25B:
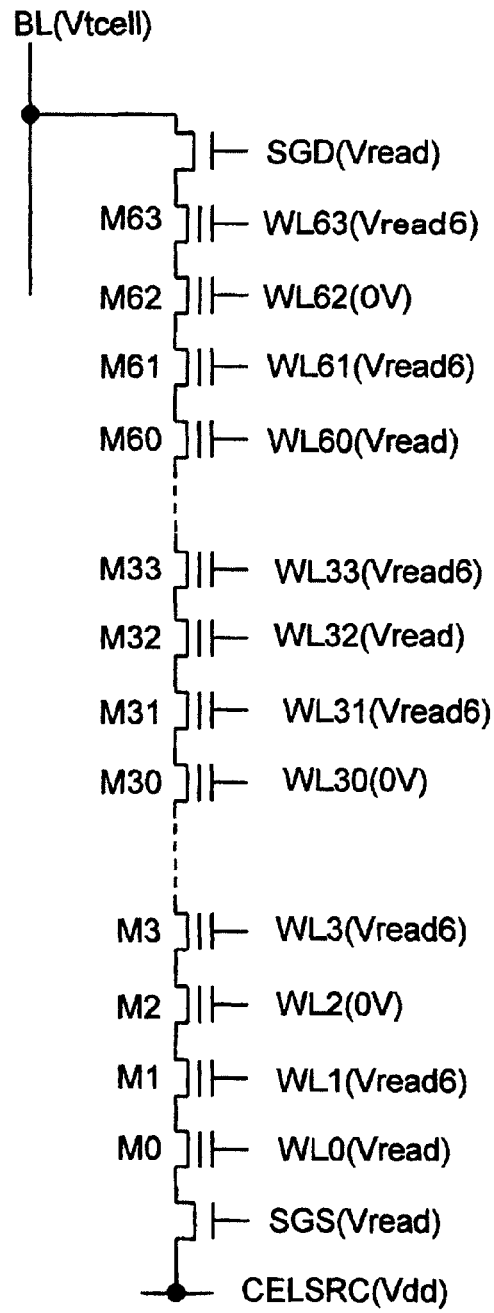
FIG. 25B is an equivalent circuit diagram illustrating the state of a voltage applied during a second erase verification operation according to the fifth embodiment.

Then, the main control circuit 106 performs a second erase verification operation (Step S502 and T4 to T6 shown in FIG. 28). In this case, first, the main control circuit 106 applies the voltage Vdd to the common source line CELSRC. In addition, the main control circuit 106 applies a voltage of 0 V to the selected bit line BL to be in a floating state. Then, as shown in FIG. 25B and a field '2nd' in the table of FIG. 27, the main control circuit 106 applies an erase verification voltage of 0 V to the word lines WL(4k+2), that is, the word lines WL2, . . . , WL30, . . . , WL62, of a memory cell group including the memory cells M(4k+2), that is, the memory cells M2, . . . , M30, . . . , M62, applies the erase verification voltage Vread6 to the word lines WL(4k+1) and WL(4k+3), that is, the word lines WL1, WL3, . . . , WL29, WL31, . . . , WL61, and WL63, of the memory cell groups including the memory cells M(4k+1) and M(4k+3), that is, the memory cells M1, M3, . . . , M29, M31, . . . , M61, and M63, and applies the erase verification voltage Vread to the word lines WL(4k), that is, the word lines WL0, . . . , WL32, . . . , WL60, of the memory cell group including the memory cells M(4k) (where k=0, 1, . . . , 15), that is, the memory cells M0, . . . , M32, . . . , M60, thereby charging the bit line BL. Then, the sense amplifier circuit 105 detects the potential of the bit line BL, and it is determined whether data is completely erased from the memory string on the basis of the level of the potential.

Figure 26A:
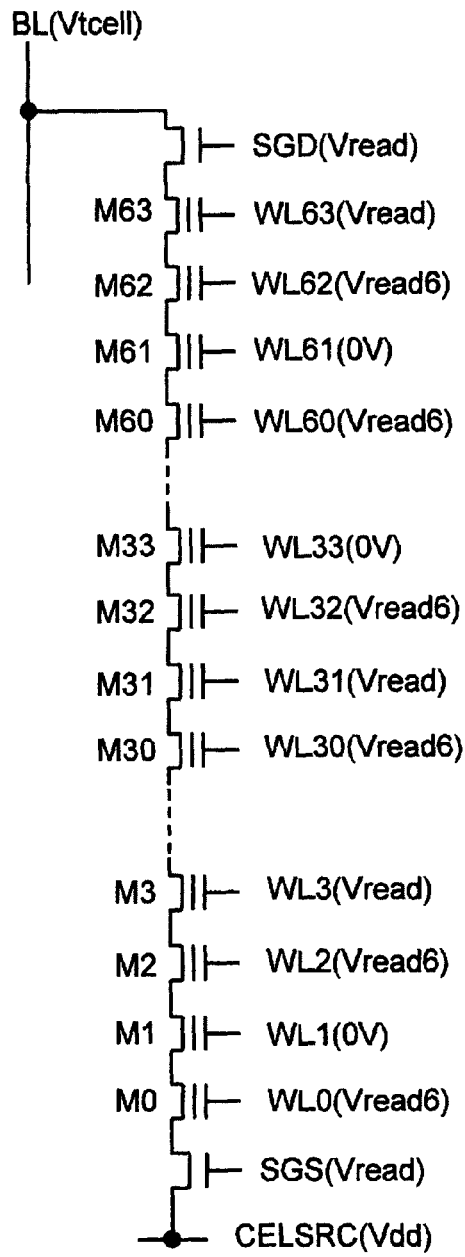
FIG. 26A is an equivalent circuit diagram illustrating the state of a voltage applied during a third erase verification operation according to the fifth embodiment.

Then, the main control circuit 106 performs a third erase verification operation (Step S503 and T7 to T9 shown in FIG. 28). In this case, first, the main control circuit 106 applies the voltage Vdd to the common source line CELSRC. In addition, the main control circuit 106 applies a voltage of 0 V to the selected bit line BL to be in a floating state. Then, as shown in FIG. 26A and a field '3rd' in the table of FIG. 27, the main control circuit 106 applies an erase verification voltage of 0 V to the word lines WL(4k+1), that is, the word lines WL1, . . . , WL33, . . . , WL61, of the memory cell group including the memory cells M(4k+1), that is, memory cells M1, ..., M33, ..., M61, applies the erase verification voltage Vread6 to the word lines WL(4k) and WL(4k+2), that is, the word lines WL0, WL2, ..., WL32, WL34, ..., WL60, and WL62, of the memory cell groups including the memory cells M(4k) and M(4k+2), that is, the memory cells M0, M2, ..., M32, M34, ..., M60, and M62, and applies the erase verification voltage Vread to the word lines WL(4k+3), that is, the word lines WL3, ..., WL31, ..., WL63, of the memory cell group including the memory cells M(4k+3) (where k= 0, 1, ..., 15), that is, the memory cells M3, ..., M31, ..., M63, thereby charging the bit line BL. Then, the sense amplifier circuit 105 detects the potential of the bit line BL, and it is determined whether data is completely erased from the memory string on the basis of the level of the potential.

Figure 26B:
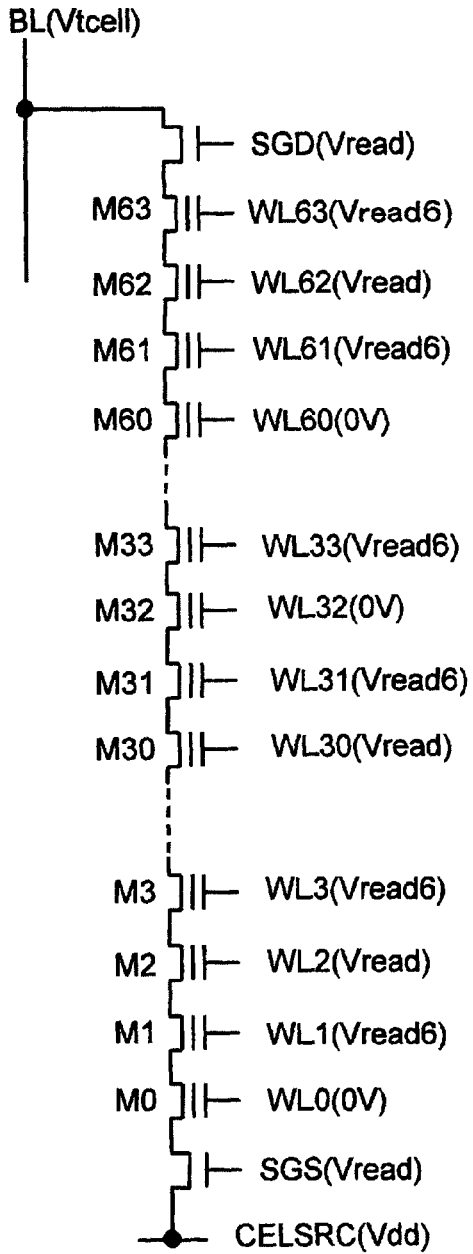
FIG. 26B is an equivalent circuit diagram illustrating the state of a voltage applied during a fourth erase verification operation according to the fifth embodiment.

Then, the main control circuit 106 performs a fourth erase verification operation (Step S504 and T10 to T12 shown in FIG. 28). In this case, first, the main control circuit 106 applies the voltage Vdd to the common source line CELSRC. In addition, the main control circuit 106 applies a voltage of 0 V to the selected bit line BL to be in a floating state. Then, as shown in FIG. 26B and a field '4th' in the table of FIG. 27, the main control circuit 106 applies an erase verification voltage of 0 V to the word lines WL(4k), that is, the word lines WL0, ..., WL32, ..., WL60, of the memory cell group including the memory cells M(4k), that is, the memory cells M0, ..., M32, ..., M60, applies the erase verification voltage Vread6 to the word lines WL(4k+1) and WL(4k+3), that is, the word lines WL1, WL3, WL5, ..., WL31, WL33, ..., WL59, WL61, and WL63, of the memory cell groups including the memory cells M(4k+1) and M(4k+3), that is, the memory cells M1, M3, M5, ..., M31, M33, ..., M59, M61, and M63, and applies the erase verification voltage Vread to the word lines WL(4k+2), that is, the word lines WL2, ..., WL30, ..., WL62, of the memory cell group including the memory cells M(4k+2) (where k=0, 1, ..., 15), that is, the memory cells M2, ..., M30, ..., M62, thereby charging the bit line BL. Then, the sense amplifier circuit 105 detects the potential of the bit line BL, and it is determined whether data is completely erased from the memory string on the basis of the level of the potential. As for the voltage Vread6, it is preferable that Vread<Vread6 in order to reduce the influence of adjacent word lines WL.

As mentioned in the third embodiment, Vread6<Vread may be preferable in order to reduce the influence of adjacent word lines WL.

As such, it is possible to improve the charge performance of the voltage applied from the common source line CELSRC to the bit line BL through the memory cell groups during each erase verification operation (1st, 2nd, 3rd, and 4th shown in FIG. 28) by dividing a plurality of memory cells in the memory string into four memory cell groups such that an erase verification voltage of 0 V is applied to every three memory cells, and performing four different erase verification operations on each of the memory cell groups to control the voltage level of the erase verification voltage. As a result, it is possible to further improve the accuracy of the erase verification operation. In addition, the order of the erase verification operations may be different from that in this embodiment. In this case, the same effects as described above are also obtained.

Next, a case in which a plurality of memory cells in a memory string including dummy cells MS and MD are divided into four memory cell groups such that an erase verification voltage of 0 V is applied to every three memory cells and four different erase verification operations are performed on each of the memory cell groups will be described with reference to an equivalent circuit of the memory string shown in FIGS. 29 and 30 and an example of the erase verification voltage applied to each memory cell group shown in FIG. 31. In the memory string shown in FIGS. 29 and 30, 64 memory cells are connected in series to each other.

Figure 29A:
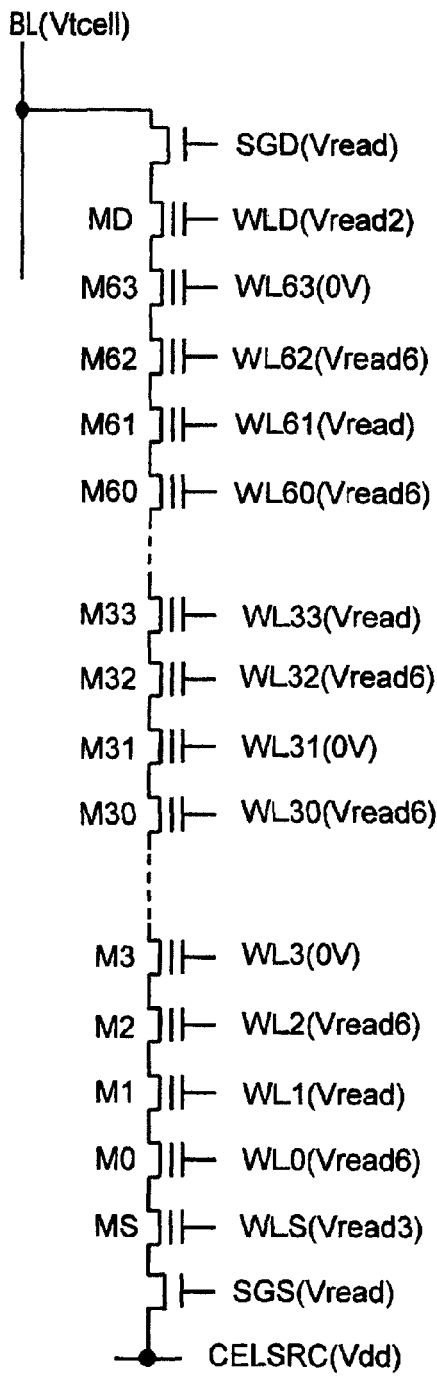
FIG. 29A is an equivalent circuit diagram illustrating the state of the voltage applied during the first erase verification operation according to the fifth embodiment.

In FIG. 29A, the main control circuit 106 performs the first erase verification operation. In this case, first, the main control circuit 106 applies the voltage Vdd to the common source line CELSRC. In addition, the main control circuit 106 applies a voltage of 0 V to the selected bit line BL to be in a floating state. Then, as shown in a field '1st' in a table of FIG. 31, the main control circuit 106 respectively applies the erase verification voltages Vread2 and Vread3 to the word lines WLD and WLS of the dummy cells MD and MS, applies an erase verification voltage of 0 V to the word lines WL(4k+3), that is, the word lines WL3, ..., WL31, ..., WL63, of the memory cell group including the memory cells M(4k+3), that is, the memory cells M3, ..., M31, ..., M63, applies the erase verification voltage Vread6 to the word lines WL(4k) and WL(4k+2), that is, the word lines WL0, WL2, ..., WL30, WL32, ..., WL60, and WL62, of the memory cell groups including the memory cells M(4k) and M(4k+2), that is, the memory cells M0, M2, ..., M30, M32, ..., M60, and M62, and applies the erase verification voltage Vread to the word lines WL(4k+1), that is, the word lines WL1, ..., WL33, ..., WL61, of the memory cell group including the memory cells M(4k+1) (where k=0, 1, ..., 15), that is, the memory cells M1, ..., M33, ..., M61, thereby charging the bit line BL. Then, the sense amplifier circuit 105 detects the potential of the bit line BL, and it is determined whether data is completely erased from the memory string on the basis of the level of the potential.

Figure 29B:
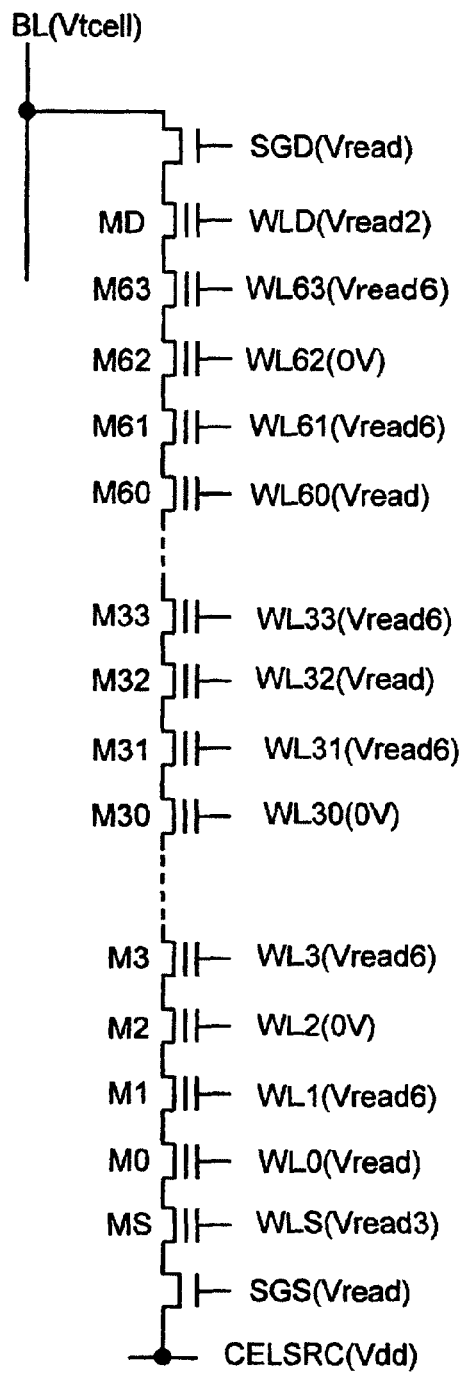
FIG. 29B is an equivalent circuit diagram illustrating the state of the voltage applied during the second erase verification operation according to the fifth embodiment.

Then, in FIG. 29B, first, the main control circuit 106 applies the voltage Vdd to the common source line CELSRC. In addition, the main control circuit 106 applies a voltage of 0 V to the selected bit line BL to be in a floating state. Then, the second erase verification operation is performed. In this case, as shown in a field '2nd' in the table of FIG. 31, the main control circuit 106 respectively applies the erase verification voltages Vread2 and Vread3 to the word lines WLD and WLS of the dummy cells MD and MS, applies an erase verification voltage of 0 V to the word lines WL(4k+2), that is, the word lines WL2, ..., WL30, ..., WL62, of the memory cell group including the memory cells M(4k+2), that is, the memory cells M2, ..., M30, ..., M62, applies the erase verification voltage Vread6 to the word lines WL(4k+1) and WL(4k+3), that is, the word lines WL1, WL3, ..., WL31, WL33, ..., WL61, and WL63, of the memory cell groups including the memory cells M(4k+1) and M(4k+3), that is, the memory cells M1, M3, ..., M31, M33, ..., M61, and M63, and applies the erase verification voltage Vread to the word lines WL(4k), that is, the word lines WL0, ..., WL32, ..., WL60, of the memory cell group including the memory cells M(4k) (where k=0, 1, ..., 15), that is, the memory cells M0, ..., M32, ..., M60, thereby charging the bit line BL. Then, the sense amplifier circuit 105 detects the potential of the bit line BL, and it is determined whether data is completely erased from the memory string on the basis of the level of the potential.

Figure 30A:
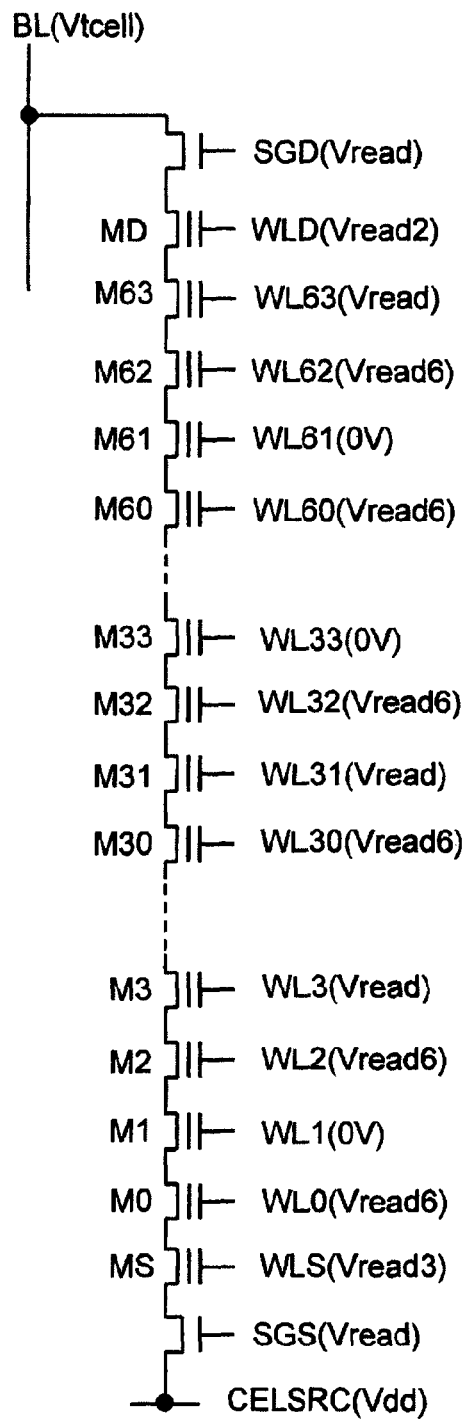
FIG. 30A is an equivalent circuit diagram illustrating the state of the voltage applied during the third erase verification operation according to the fifth embodiment.

Then, in FIG. 30A, first, the main control circuit 106 applies the voltage Vdd to the common source line CELSRC. In addition, the main control circuit 106 applies a voltage of 0 V to the selected bit line BL to be in a floating state. Then, the third erase verification operation is performed. In this case, as shown in a field '3rd' in the table of FIG. 31, the main control circuit 106 respectively applies the erase verification voltages Vread2 and Vread3 to the word lines WLD and WLS of the dummy cells MD and MS, applies an erase verification voltage of 0 V to the word lines WL(4k+1), that is, the word lines WL1, ..., WL33, ..., WL61, of the memory cell group including the memory cells M(4k+1), that is, the memory cells M1, ..., M33, ..., M61, applies the erase verification voltage Vread6 to the word lines WL(4k) and WL(4k+2), that is, the word lines WL0, WL2, ..., WL30, WL32, ..., WL60, and WL62, of the memory cell groups including the memory cells M(4k) and M(4k+2), that is, the memory cells M0, M2, ..., M30, M32, ..., M60, and M62, and applies the erase verification voltage Vread to the word lines WL(4k+3), that is, the word lines WL3, ..., WL31, ..., WL63, of the memory cell group including the memory cells M(4k+3) (where k=0, 1, ..., 15), that is, the memory cells M3, ..., M31, ..., M63, thereby charging the bit line BL. Then, the sense amplifier circuit 105 detects the potential of the bit line BL, and it is determined whether data is completely erased from the memory string on the basis of the level of the potential.

Figure 30B:
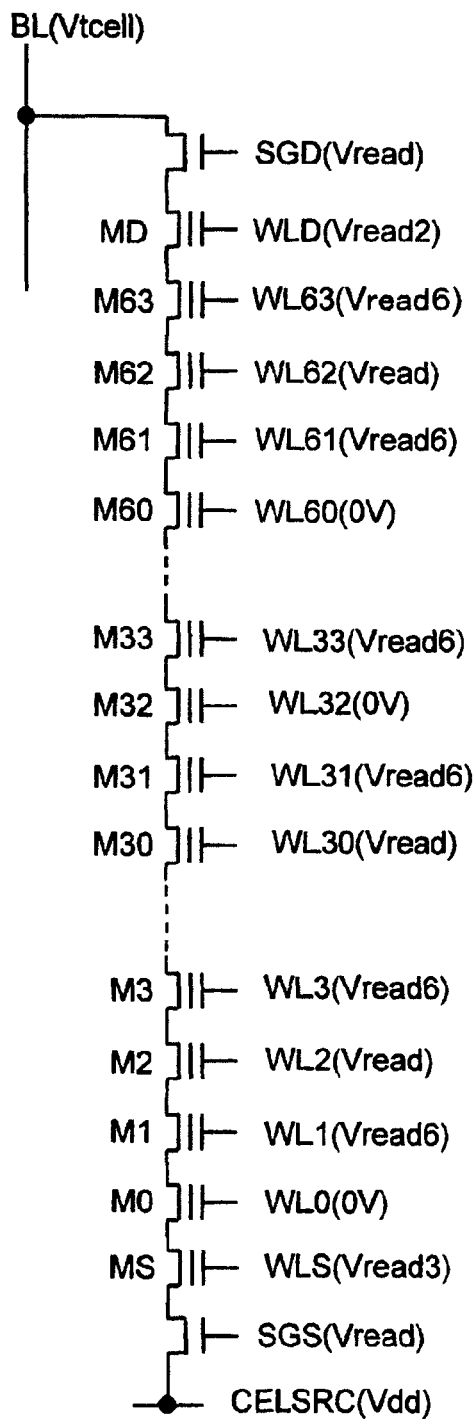
FIG. 30B is an equivalent circuit diagram illustrating the state of the voltage applied during the fourth erase verification operation according to the fifth embodiment.

Then, in FIG. 30B, first, the main control circuit 106 applies the voltage Vdd to the common source line CELSRC. In addition, the main control circuit 106 applies a voltage of 0 V to the selected bit line BL to be in a floating state. Then, the fourth erase verification operation is performed. In this case, as shown in a field '4th' in the table of FIG. 31, the main control circuit 106 respectively applies the erase verification voltages Vread2 and Vread3 to the word lines WLD and WLS of the dummy cells MD and MS, applies an erase verification voltage of 0 V to the word lines WL(4k), that is, the word lines WL0, ..., WL32, ..., WL60, of the memory cell group including the memory cells M(4k), that is, the memory cells M0, ..., M32, ..., M60, applies the erase verification voltage Vread6 to the word lines WL(4k+1) and WL(4k+3), that is, the word lines WL1, WL3, ..., WL31, WL33, ..., WL61, and WL63, of the memory cell groups including the memory cells M(4k+1) and M(4k+3), that is, the memory cells M1, M3, ..., M31, M33, ..., M61, and M63, and applies the erase verification voltage Vread to the word lines WL(4k+2), that is, the word lines WL2, ..., WL30, ..., WL62, of the memory cell group including the memory cells M(4k+2) (where k=0, 1, ..., 15), that is, the memory cells M2, ..., M30, ..., M62, thereby charging the bit line BL. Then, the sense amplifier circuit 105 detects the potential of the bit line BL, and it is determined whether data is completely erased from the memory string on the basis of the level of the potential. Similar to FIG. 4B, in general, it is preferable that the voltage satisfy Vread3≦Vread2≦Vread.

As such, the erase verification voltage application conditions written in the table shown in FIG. 31 are applied to the memory string including the dummy cells MS and MD shown in FIGS. 29 and 30, and a plurality of memory cells in the memory string are divided into four memory cell groups such that an erase verification voltage of 0 V is applied to every three memory cells. Then, four different erase verification operations are performed on each of the memory cell groups to control the voltage level of the erase verification voltage. In this way, it is possible to improve the charge performance of the voltage applied from the common source line CELSRC to the bit line BL through the memory cell groups during each erase verification operation (1st, 2nd, 3rd, and 4th shown in FIG. 31). As a result, it is possible to further improve the accuracy of the erase verification operation performed on the memory string including the dummy cells. In addition, the order of the erase verification operations may be different from that in this embodiment. In this case, the same effects as described above are also obtained.

Sixth Embodiment

In a sixth embodiment, a case in which the controller 200 counts the number of accesses to the NAND flash memory 100 and changes the number of divided memory cells (the number of divided memory cell groups) during an erase verification operation on the basis of the number of accesses. The overall structure of the NAND flash memory according to the sixth embodiment is the same as that of the NAND flash memory 100 shown in FIG. 1, and an illustration and description thereof will be omitted.

Figure 32:
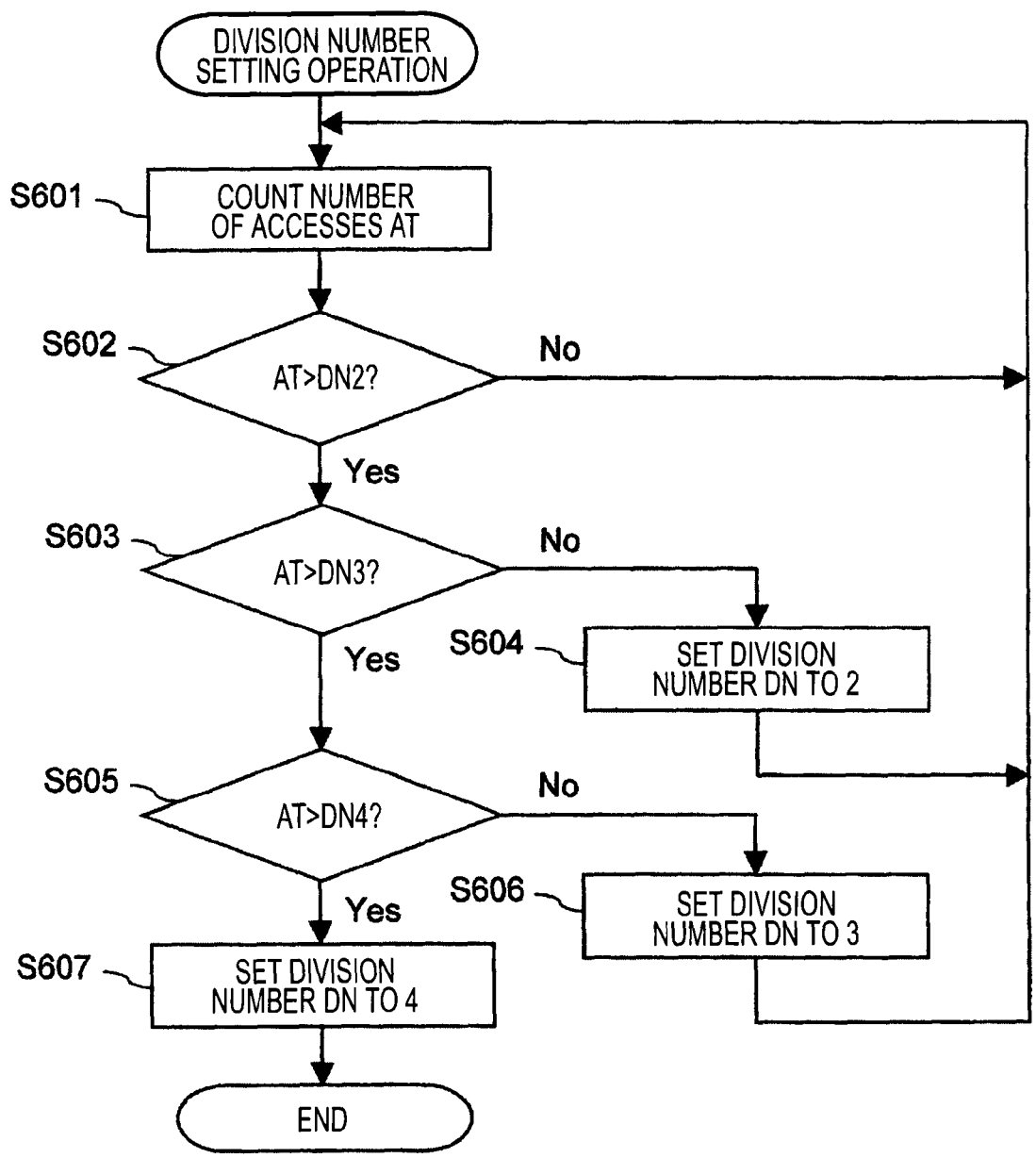
FIG. 32 is a flowchart illustrating a division number setting operation performed by a controller according to a sixth embodiment of the invention.

A division number setting operation performed by the controller 200 will be described with reference to a flowchart shown in FIG. 32. Division setting numbers DN2, DN3, and DN4 corresponding to division numbers 2, 3, and 4 are set in the register 202 of the controller 200. These division setting numbers DN2, DN3, and DN4 are set to correspond to the number of accesses AT, which will be described below, and satisfy the following relationship: DN2<DN3<DN4.

The controller 200 controls the counter 201 to count the number of accesses AT to the NAND flash memory 100 (Step S601). Then, the controller 200 compares the number of accesses AT with the division setting number DN2 set in the register 202, and determines whether the number of accesses AT is larger than the division setting number DN2 (Step S602). If the number of accesses AT is equal to or smaller than the division setting number DN2 (Step S602: No), the process returns to Step S601. If the number of accesses AT is larger than the division setting number DN2 (Step S602: Yes), the process proceeds to Step S603.

Then, the controller 200 compares the number of accesses AT with the division setting number DN3 set in the register 202, and determines whether the number of accesses AT is larger than the division setting number DN3 (Step S603). If the number of accesses AT is equal to or smaller than the division setting number DN3 (Step S603: No), the controller sets the division number DN to '2' (Step 604). If the number of accesses AT is larger than the division setting number DN3 (Step S603: Yes), the process proceeds to Step S605.

Then, the controller 200 compares the number of accesses AT with the division setting number DN4 set in the register 202, and determines whether the number of accesses AT is larger than the division setting number DN4 (Step S605). If the number of accesses AT is equal to or smaller than the division setting number DN4 (Step S605: No), the controller sets the division number DN to '3' (Step S606). If the number of accesses AT is larger than the division setting number DN4 (Step S605: Yes), the process proceeds to Step S607 to set the division number DN to '4'.

Then, the controller 200 sets the division number DN set by the division number setting operation to the NAND flash memory 100. The main control circuit 106 of the NAND flash memory 100 performs the erase verification operation with the division number 2, 3, or 4 according to the first to fifth embodiments on the basis of the division number DN set by the controller 200.

In the above embodiment, the division number is increased from 1 to 4. However, the division number may increase from 1 to 2, or as 1, 2, 4, skipping 3, for example. Reversely the division number may decrease from 4 to 1, from 2 to 1, or as 4, 2, 1, skipping 3, for example. That is, the division number may be adjusted depending on the situation.

As described above, in the sixth embodiment, the controller 200 can set the division number of the memory cell groups during the erase verification operation on the basis of the number of accesses to the NAND flash memory 100. In this way, in the NAND flash memory 100, it is possible to appropriately set a division number for dividing the memory cell groups during the erase verification operation on the basis of the accumulated number of accesses. As a result, it is possible to further improve the accuracy of the erase verification operation performed on a memory string.

In the third to fifth embodiments, it is preferable that the erase verification voltages Vread4, Vread5, and Vread6 set during the erase verification operation satisfy Vread4≧Vread5≧Vread6.

As described with reference to the above embodiments, there is provided a non-volatile semiconductor storage device and a memory system capable of improving a charge performance with respect to a bit line during an erase verification operation and improving the accuracy of the erase verification operation.

According to the above embodiments, it is possible to provide a non-volatile semiconductor storage device and a memory system capable of improving a charge performance with respect to a bit line during an erase verification operation and improving the accuracy of the erase verification operation.

What is claimed is:

1. A non-volatile semiconductor storage device comprising:
    a memory cell array including a plurality of memory strings, each of the memory strings having:
        a first end;
        a second end; and
        a plurality of memory cells connected in series between the first end and the second end, the memory cells being categorized into at least two memory cell groups;
        a first end that is one end of the memory string; and
        a second end that is the other end of the memory string;
    a plurality of first selection transistors connected to the respective first ends of the memory strings;
    a plurality of second selection transistors connected to the respective second ends of the memory strings;
    a plurality of bit lines connected to the respective second selection transistors;
    a plurality of word lines connected to the memory cells; and
    a control circuit configured to apply different control voltages to the respective word lines so that the same voltage is applied to the memory cells belonging to the same memory cell group when an erase verification is performed on the memory cell array,
    wherein any one of the memory cells and the adjacent memory cells belongs to different groups.

2. The device according to claim 1 further comprising a plurality of dummy cells arranged between the first ends and the first selection transistors and between the second ends and the second selection transistors, the dummy cells being connected to dummy word lines,
    wherein, when the erase verification is performed on the memory cell array, the control circuit configured to apply different control voltages to the respective word lines and the respective dummy word lines so that the same voltage is applied to the memory cells belonging to the same memory cell group.

3. The device according to claim 2, wherein, when the erase verification is performed on the memory cells belonging to one of the memory cell groups, a voltage applied to the first selection transistor and the second selection transistor is lower than a voltage applied to the memory cells belonging to the one of the memory cell groups.

4. The device according to claim 2, wherein, when the erase verification is performed on the memory cell array, a voltage applied to the first selection transistor and the second selection transistor is higher than a voltage applied to the dummy cells adjacent to the first selection transistor and the voltage applied to the dummy cells adjacent to the first selection transistors is higher than a voltage applied to the dummy cells adjacent to the second selection transistors.

5. The device according to claim 2,
    wherein the memory cell groups are consisting of four memory cell groups; and
    wherein, when the erase verification is performed on the memory cell array, a voltage applied to the memory cells being not adjacent to the memory cells to be verified is the same voltage applied to the first selection transistors and the second selection transistors.

6. The device according to claim 1,
    wherein the memory cell groups include a first memory cell group and a second memory cell group,
    wherein the different control voltages include a first control voltage and a second control voltage,
    wherein, in a first state of the erase verification, the control circuit applies the first control voltage to the memory cells belonging to the first memory cell group, and applied the second control voltage to the memory cells belonging to the second memory cell group, and
    wherein, in a second state of the erase verification the control circuit applies the second control voltage to the memory cells belonging to the first memory cell group, and applies the first control voltage to the memory cells belonging to the second memory cell group, and
    wherein the first control voltage is different from the second control voltage.

7. The device according to claim 6 further comprising a plurality of dummy cells arranged between the first ends and the first selection transistors and between the second ends and the second selection transistors, the dummy cells being connected to dummy word lines, and
    wherein, when the erase verification is performed on the memory cell array, the control circuit applies different control voltages to the respective word lines and the respective dummy word lines so that the same voltage is applied to the memory cells belonging to the same memory cell group.

8. The device according to claim 7, wherein, when the erase verification is performed on the memory cells belonging to one of the memory cell groups, a voltage applied to the first selection transistor and the second selection transistor is lower than a voltage applied to the memory cells belonging to the one of the memory cell groups.

9. The device according to claim 7, wherein, when the erase verification is performed on the memory cell array, a voltage applied to the first selection transistor and the second selection transistor is higher than a voltage applied to the dummy cells adjacent to the first selection transistor and the voltage applied to the dummy cells adjacent to the first selection transistors is higher than a voltage applied to the dummy cells adjacent to the second selection transistors.

10. The device according to claim 7, wherein the memory cell groups are consisted of four memory cell groups;
    wherein, when the erase verification is performed on the memory cell array, a voltage applied to the memory cells being not adjacent to the memory cells to be verified is the same voltage applied to the first selection transistors and the second selection transistors.

11. The device according to claim 6, wherein, when the erase verification is performed on the memory cells belonging to the first memory cell group, a voltage applied to the first selection transistor and the second selection transistor is lower than the second control voltage.

12. The device according to claim 6, wherein the memory cell groups are consisted of four memory cell groups;
   wherein, when the erase verification is performed on the memory cell array, a voltage applied to the memory cells being not adjacent to the memory cells to be verified is the same voltage applied to the first selection transistors and the second selection transistors.

13. The device according to claim 1, wherein, when the erase verification is performed on the memory cells belonging to one of the memory cell groups, a voltage applied to the first selection transistor and the second selection transistor is lower than a voltage applied to the memory cells belonging to the one of the memory cell groups.

14. The device according to claim 1,
   wherein the memory cell groups are consisting of four memory cell groups; and
   wherein, when the erase verification is performed on the memory cell array, a voltage applied to the memory cells being not adjacent to the memory cells to be verified is the same voltage applied to the first selection transistors and the second selection transistors.

15. A memory system comprising:
   a non-volatile semiconductor storage device including:
      a memory cell array including a plurality of memory strings, each of the memory strings having:
         a plurality of memory cells connected in series and categorized into at least two memory cell groups;
         a first end that is one end of the memory string; and
         a second end that is the other end of the memory string;
      a plurality of first selection transistors connected to the respective first ends;
      a plurality of second selection transistors connected to the respective second ends;
      a plurality of bit lines connected to the respective second selection transistors;
      a plurality of word lines connected to the respective memory cells; and
      a control circuit configured to apply different control voltages to the respective word lines so that the same voltage is applied to the memory cells belonging to the same memory cell group when an erase verification is performed on the memory cell array; and
   a controller including:
      a counter that counts the number of accesses to the memory cell array; and
      a setting unit configured to determine the number of the memory cell groups based on the number of accesses counted by the counter,
   wherein any one of the memory cells and the adjacent memory cells belongs to different groups.

* * * * *